United States Patent
Okamoto et al.

(10) Patent No.: US 10,031,407 B2
(45) Date of Patent: Jul. 24, 2018

(54) LIGHT SOURCE UNIT AND PROJECTOR

(71) Applicant: USHIO DENKI KABUSHIKI KAISHA, Tokyo (JP)

(72) Inventors: Masashi Okamoto, Hyogo (JP); Takanori Samejima, Hyogo (JP); Yuichi Miura, Hyogo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 372 days.

(21) Appl. No.: 15/000,948

(22) Filed: Jan. 19, 2016

(65) Prior Publication Data

US 2016/0131968 A1 May 12, 2016

Related U.S. Application Data

(63) Continuation of application No. PCT/JP2014/069036, filed on Jul. 17, 2014.

(30) Foreign Application Priority Data

Jul. 19, 2013 (JP) ................................ 2013-149997

(51) Int. Cl.
G03B 21/20 (2006.01)
H01S 5/0683 (2006.01)
(Continued)

(52) U.S. Cl.
CPC ....... *G03B 21/2053* (2013.01); *G03B 21/208* (2013.01); *G03B 21/2013* (2013.01);
(Continued)

(58) Field of Classification Search
CPC ............ G03B 21/2053; G03B 21/2033; G03B 21/2013; G03B 21/2006; H04N 9/312;
(Continued)

(56) References Cited

U.S. PATENT DOCUMENTS

| 2005/0248733 A1 | 11/2005 | Sakata et al. |
| 2006/0132403 A1 | 6/2006 | Maximus et al. |
| 2007/0103646 A1* | 5/2007 | Young ...................... G01J 1/32 |
| | | 353/52 |
| 2009/0174331 A1 | 7/2009 | Tanaka |

FOREIGN PATENT DOCUMENTS

| JP | H10-133303 A | 5/1998 |
| JP | 2001-142141 A | 5/2001 |

(Continued)

OTHER PUBLICATIONS

International Search Report issued in Application No. PCT/JP2014/069036, dated Sep. 30, 2014.

*Primary Examiner* — Christina Riddle
*Assistant Examiner* — Christopher Lamb, II
(74) *Attorney, Agent, or Firm* — Michael Best & Friedrich LLP

(57) ABSTRACT

A light source unit including: a plurality of elemental light sources each including a light emitting element and a drive circuit; a control circuit configured to control the drive circuit; and a luminous flux characteristic measurement section configured to measure received output luminous fluxes to generate luminous flux chromaticity-intensity correlation data. The control circuit generates a single-color color-phase indicating value, based on the luminous flux chromaticity-intensity correlation data. The control circuit determines a ratio of intensity of additional light to intensity of main component light to allow the single-color color-phase indicating value to become equal to a target value thereof, and generates an integrated color-phase indicating value, based on the luminous flux chromaticity-intensity correlation data. The control circuit performs feedback control on the drive circuits to allow a difference between the integrated color-phase indicating value and a target value thereof to be small.

11 Claims, 6 Drawing Sheets

(51) Int. Cl.
*G03B 33/06* (2006.01)
*G09G 3/34* (2006.01)
*H01S 5/40* (2006.01)

(52) U.S. Cl.
CPC ......... *G03B 21/2033* (2013.01); *G03B 33/06* (2013.01); *G09G 3/3413* (2013.01); *H01S 5/0683* (2013.01); *H01S 5/4087* (2013.01)

(58) Field of Classification Search
CPC .. H04N 9/3123; H04N 9/3138; H04N 9/3155; H04N 9/3158; H04N 9/3161; H04N 9/3164; H04N 9/3194; H01S 5/0683; G09G 3/3406; G09G 3/3413; G09G 3/342
See application file for complete search history.

(56) References Cited

FOREIGN PATENT DOCUMENTS

| | | |
|---|---|---|
| JP | 2004-163527 A | 6/2004 |
| JP | 2004-252112 A | 9/2004 |
| JP | 2005-321524 A | 11/2005 |
| JP | 2006-171722 A | 6/2006 |
| JP | 2006-252777 A | 9/2006 |
| JP | 2007-156211 A | 6/2007 |
| JP | 2008-134378 A | 6/2008 |
| JP | 2008-185924 A | 8/2008 |
| JP | 2008-282936 A | 11/2008 |
| JP | 2010-152326 A | 7/2010 |
| WO | WO-2014/136882 A1 | 9/2014 |

* cited by examiner

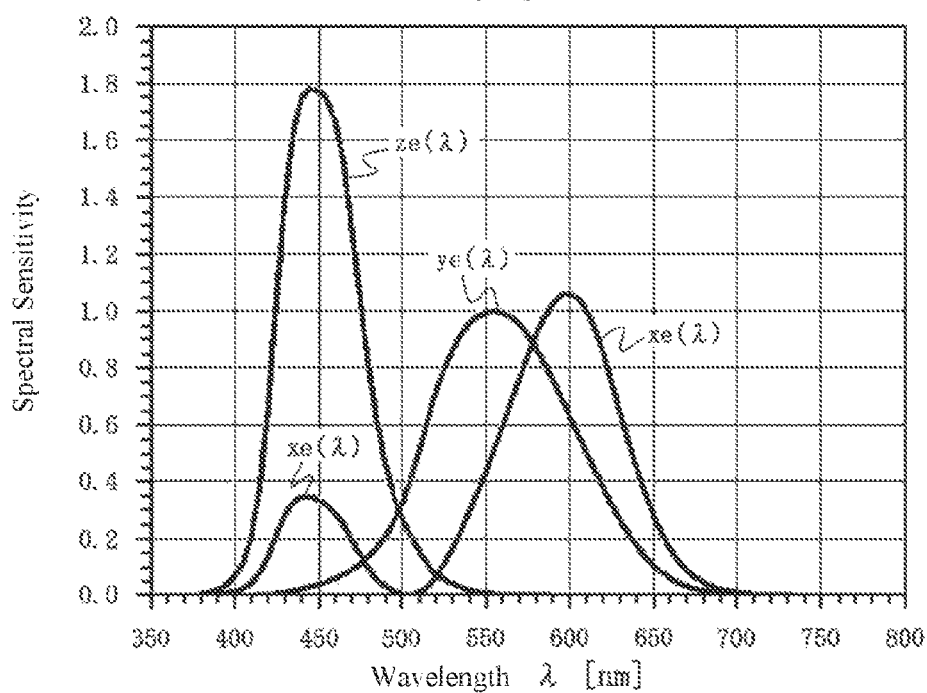
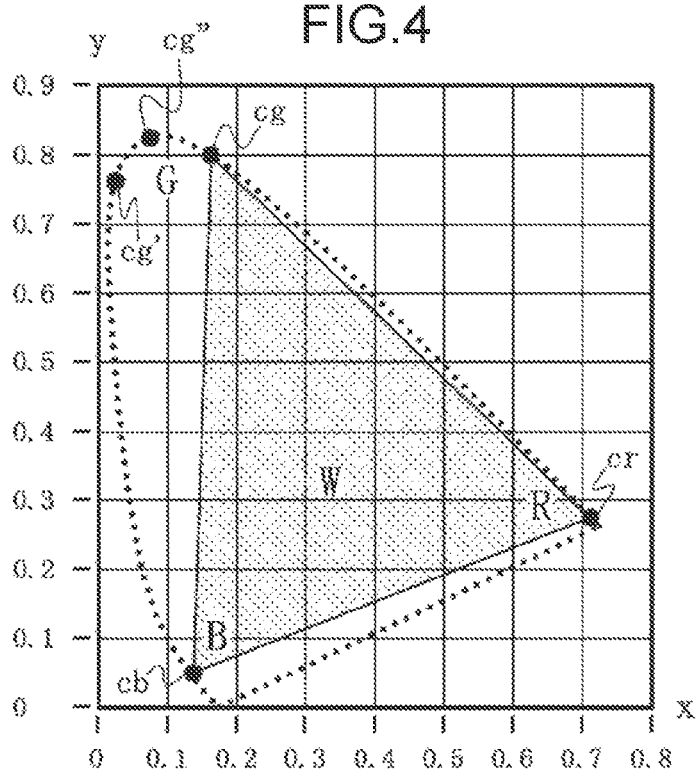

Related Art

LIGHT SOURCE UNIT AND PROJECTOR

CROSS REFERENCE TO RELATED APPLICATIONS

This is a continuation of International Application No. PCT/JP2014/069036, filed Jul. 17, 2014, which claims the benefit of Japanese Priority Patent Application No. 2013-149997, filed on Jul. 19, 2013, the entire contents of both of which are incorporated herein by reference in their entirety.

BACKGROUND

The invention relates to a light source unit that uses light emitting elements such as semiconductor lasers for a plurality of different wavelength bands and is usable in an optical apparatus such as a projector, and to a projector.

For example, in an image display projector such as DLP (trademark) projector and a liquid crystal projector and in a photomask exposure apparatus, a high luminance discharge lamp (HID lamp) such as a xenon lamp and an ultra-high pressure mercury lamp has been used so far. As an example, a principle of a projector is described with reference to FIG. 8 that is a diagram for explaining a part of one kind of existing projectors (see, for example, Japanese Unexamined Patent Application Publication No. 2004-252112).

Light from a light source (SjA) that is formed of, for example, a high luminance discharge lamp enters an incident end (PmiA) of a homogenizing means (FmA) with the help of focusing means (illustration thereof is omitted) that is formed of, for example, a concave reflector or a lens, and entering light is output from an exit end (PmoA). Here, as the homogenizing means (FmA), for example, a light guide may be used. The light guide is also referred to as, for example, a rod integrator or a light tunnel, and is configured of a prism formed of a light transmissive material such as glass and a resin. The light entering the incident end (PmiA) is totally reflected repeatedly by side surfaces of the homogenizing means (FmA) and propagates through the homogenizing means (FmA), in accordance with the principle same as that of the optical fiber. Accordingly, even if distribution of light entering the incident end (PmiA) has unevenness, the homogenizing means (FmA) functions to sufficiently uniformize illuminance on the exit end (PmoA).

Note that, in addition to the light guide configured of a prism formed of a light transmissive material such as glass and a resin described above, there is a light guide that is a hollow square tube and whose inner surface is configured of a reflector. The light guide of this type performs the same function as that of the light guide configured of a prism, by propagating light while allowing the light to be reflected repeatedly by the inner surface.

An illumination lens (Ej1A) is disposed such that a square image of the exit end (PmoA) is formed on a two-dimensional light intensity modulator (DmjA). As a result, the two-dimensional light intensity modulator (DmjA) is illuminated with the light output from the exit end (PmoA). Incidentally, in FIG. 8, a mirror (MjA) is disposed between the illumination lens (Ej1A) and the two-dimensional light intensity modulator (DmjA). The two-dimensional light intensity modulator (DmjA) then so modulates the light according to a picture signal as to direct the modulated light to a direction entering an image projection lens (Ej2A) or to a direction not entering the image projection lens (Ej2A) for each pixel, to display an image on a screen (Tj).

The two-dimensional light intensity modulator as described above is also referred to as a light valve. In the case of the optical system of FIG. 8, normally, DMD (trademark, digital micro-mirror device) is often used as the two-dimensional light intensity modulator (DmjA).

In addition to the above-described light guide, the homogenizing means includes a fly eye integrator. A principle of a projector using the fly eye integrator as the homogenizing means is described with reference to FIG. 9, as an example. FIG. 9 is a diagram for explaining a part of one kind of existing projectors (see, for example, Japanese Unexamined Patent Application Publication No. 2001-142141).

Light from a light source (SjB) configured of, for example, a high luminance discharge lamp enters, as substantially parallel luminous flux, an incident end (PmiB) of a homogenizing means (FmB) configured of a fly eye integrator with the help of collimator means (illustration thereof is omitted) formed of, for example, a concave reflector or a lens, and resultant light is output from an exit end (PmoB). Here, the homogenizing means (FmB) is configured of a combination of a front fly eye lens (F1B) on incident side, and a rear fly eye lens (F2B) on exit side and an illumination lens (Ej1B). Each of the front fly eye lens (F1B) and the rear fly eye lens (F2B) is formed by arranging a plurality of square lenses that has the same focusing distance and the same shape, vertically and horizontally.

Each of the front fly eye lenses (F1B) and the rear fly eye lens (F2B) corresponding thereto configure a Kohler illumination optical system. A plurality of Kohler illumination optical systems are thus arranged vertically and horizontally. Typically, the Kohler illumination optical system is configured of two lenses, and a front lens collects light to illuminate a target surface (a surface desired to be illuminated) uniformly. At this time, the two lenses are disposed so that the front lens forms a light source image not on the target surface but on a center of a surface of a rear lens and the rear lens forms an image of an outer square shape of the front lens on the target surface. The action of the rear lens is to prevent a phenomenon in which illuminance in the periphery of the square image formed on the target surface is dropped depending on the size of the light source when the light source is not a complete point light source but has a finite size. The phenomenon occurs when the rear lens is not provided. It is possible to uniform illuminance over the periphery of the square image on the target surface by the action of the rear lens, without depending on the size of the light source.

Here, in the case of the optical system in FIG. 9, substantially parallel luminous flux basically enters the homogenizing means (FmB). Therefore, the front fly eye lens (F1B) and the rear fly eye lens (F2B) are disposed such that a distance therebetween becomes equal to the focusing distance thereof, and therefore, an image on the target surface of uniform illumination as Kohler illumination optical system is generated to the infinity. Incidentally, since the illumination lens (Ej1B) is disposed on a rear stage of the rear fly eye lens (F2B), the target surface is drawn on a focusing surface of the illumination lens (Ej1B) from the infinity. Each of the plurality of Kohler illumination optical systems arranged vertically and horizontally is parallel to an incident optical axis (ZiB), and luminous flux enters each of the Kohler illumination optical systems substantially axisymmetrically to the center axis thereof. Therefore, output luminous flux is also axisymmetrical. Accordingly, images of the outputs of all of the Kohler illumination optical systems are formed on the same target surface on the focusing surface of the illumination lens (Ej1B) by property of the lens in which light beams entering a lens surface at the same angle are so refracted as to travel toward the same point on the focusing surface irrespective of incident positions of the respective light beams on the lens surface, namely, by Fourier transform function of the lens.

As a result, illumination distributions on the respective lens surfaces of the front fly eye lenses (F1B) are all overlapped, and thus a synthesized square image whose illuminance distribution is more uniform than that in the case of one Kohler illumination optical system, is formed on the incident optical axis (ZiB). When the two-dimensional light intensity modulator (DmjB) is disposed on the position of the synthesized square image, the two-dimensional light intensity modulator (DmjB) that is an illumination target is illuminated with the light output from the exit end (PmoB). In the illumination, a polarization beam splitter (MjB) is disposed between the illumination lens (Ej1B) and the two-dimensional light intensity modulator (DmjB) to reflect the light toward the two-dimensional light intensity modulator (DmjB). The two-dimensional light intensity modulator (DmjB) modulates the light and reflects the modulated light such that the polarization direction of light for each pixel is rotated by 90 degrees or is not rotated, according to a picture signal. As a result, only the rotated light passes through the polarization beam splitter (MjB) and enters an image projection lens (Ej3B), thereby displaying an image on the screen (Tj).

In the case of the optical system in FIG. 9, typically, LCOS (liquid crystal on silicon, trademark, silicon liquid crystal device) is often used as the two-dimensional light intensity modulator (DmjB). In a case of such a liquid crystal device, only a component of light in a specified polarization direction is effectively modulated. Therefore, a component of light parallel to the specified polarization direction is normally transmitted as is. However, in the optical system in FIG. 9, a polarization aligning device (PcB) that rotates polarization direction of only a component of light perpendicular to the specified polarization direction by 90 degrees and consequently allows all of light to be effectively used may be interposed, for example, on a rear stage of the rear fly eye lens (F2B). In addition, for example, a field lens (Ej2B) may be interposed immediately before the two-dimensional light intensity modulator (DmjB) so that substantially parallel light enters the two-dimensional light intensity modulator (DmjB).

Incidentally, in addition to the reflective two-dimensional light intensity modulator illustrated in FIG. 9, a transmissive liquid crystal device (LCD) is also used with a compatible optical arrangement as the two-dimensional light intensity modulator (see, for example, Japanese Unexamined Patent Application Publication No. H10-133303).

Incidentally, in a common projector, to perform color display of an image, for example, a dynamic color filter such as a color wheel is disposed on the rear stage of the homogenizing means to illuminate the two-dimensional light intensity modulator with color sequential luminous fluxes of R (red), G (green), and B (blue), and color display is thus achieved time-divisionally. Alternatively, an optical system in which a dichroic mirror or a dichroic prism is disposed on the rear stage of the homogenizing means to illuminate the two-dimensional light intensity modulator that is provided independently for each color, with light color-separated to three primary colors R, G, and B, and a dichroic mirror or a dichroic prism is disposed to perform color synthesis of the modulated luminous fluxes of the three primary colors R, G, and B is configured. However, to avoid complication, these are omitted in FIG. 8 and FIG. 9.

In Japanese Unexamined Patent Application Publication No. 2006-252777, there is disclosed a technology in which it is determined whether gradient of the spectral sensitivity characteristics is varied in a direction with long emission wavelength or in a direction with short emission wavelength, or is not varied, based on light intensity detection that is performed for emission wavelength band of a light source with use of a positive optical sensor and a negative optical sensor, and a reference level of power supply control of light sources of colors R, G, and B is increased or decreased based on the determination result.

In Japanese Unexamined Patent Application Publication No. 2007-156211, there is disclosed a technology allowing light sources of the respective colors R, G, and B to emit light color-sequentially. By the technology, white balance is corrected by performing control such that difference between outputs of the optical sensors and the target values thereof becomes small while assuming that the spectral sensitivity distributions of the optical sensors of the respective colors R, G, and B are equivalent to those of respective three color matching functions in the XYZ color system recommended by Commission International de l'Éclairage (CIE).

In Japanese Unexamined Patent Application Publication No. 2008-134378, there is disclosed a technology in which an angle of a dichroic mirror is varied based on a detection result of a photodetection sensor that detects output and a color from an LED light source, and an undesirable wavelength component of light emitted from the LED is discarded to correct color.

Further, in Japanese Unexamined Patent Application Publication No. 2010-152326, there is disclosed a technology in which in a projector that makes LED light sources of respective colors R, G, and B to emit light color-sequentially, in order to cope with variation of emission chromaticity caused by variation of current supplied to LEDs, for example, a section that mixes emitted light of colors G and B even in a frame of the color R to control chromaticity of the color R in the frame of the color R by color synthesis, performs, every frame generation, excessive correction setting, on purpose, on color of a frame of the color R to be generated to chromaticity at which an error of chromaticity of the frame of the color R field having been generated is offset, thereby always allowing for correct color reproduction with use of afterimage effect in visual stimulation to a human.

SUMMARY

According to an embodiment of the invention, there is provided a light source unit including: a plurality of elemental light sources each including a light emitting element and a drive circuit, the light emitting element configured to emit light of a predetermined wavelength band, the drive circuit configured to drive the light emitting element; a control circuit configured to control the drive circuit; and a luminous flux characteristic measurement section configured to receive an R-color output luminous flux, a G-color output luminous flux, and a B-color output luminous flux each of which is configured of radiated light from the light emitting element and measure the received output luminous fluxes to generate luminous flux chromaticity-intensity correlation data correlated with chromaticity coordinates of light and light intensity, the R-color output luminous flux, the G-color output luminous flux, and the B-color output luminous flux being radiated to outside through optical paths different from one another while being separated from one another. The G-color output luminous flux includes main component light output from a G-color light emitting element that is the light emitting element for G-color. The R-color output luminous flux is generated by mixing main component light output from an R-color light emitting element that is the light emitting element for R-color and additional light output from a first G-color light emitting element for additional light that is the light emitting element for G-color independent of the G-color light emitting element. The B-color output luminous flux is generated by mixing main component light output from a B-color light emitting element that is the light emitting element for B-color and additional light output from a second G-color light emitting element for additional light that is the light emitting element for G-color independent of the G-color light emitting element. The control circuit intermittently acquires the luminous flux chromaticity-intensity correlation data for each of the R-color output luminous flux, the G-color output luminous flux, and the B-color output luminous flux. The control circuit generates a single-color color-phase indicating value correlated at least one of chromaticity coordinates of an output luminous flux generated by mixing with the additional light, based on the luminous flux chromaticity-intensity correlation data. The control circuit determines a ratio of intensity of the additional light to intensity of the main component light to allow the single-color color-phase indicating value to become equal to a target value of the single-color color-phase indicating value, and generates an integrated color-phase indicating value, for an output luminous flux generated by mixing with the additional light, correlated with chromaticity coordinates of integrated light of the R-color output luminous flux, the G-color output luminous flux, and the B-color output luminous flux, based on the luminous flux chromaticity-intensity correlation data. The control circuit performs feedback control on the drive circuits for each of the R-color output luminous flux, the G-color output luminous flux, and the B-color output luminous flux to allow a difference between the integrated color-phase indicating value and a target value of the integrated color-phase indicating value to be small.

A projection display section of the projector may project and display an image with use of the light source unit. Output luminous fluxes of three primary colors R, G, and B may be allowed to have practically necessary color-phase stability, and it is possible to maintain color-phase of integration of the output luminous fluxes of R, G, and B at target color-phase.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 3 is a schematic diagram of concept relating to the technology of the light source unit according to the embodiment of the invention.

FIG. 4 is a schematic diagram of concept relating to the technology of the light source unit according to the embodiment of the invention.

DETAILED DESCRIPTION

Figure 1:
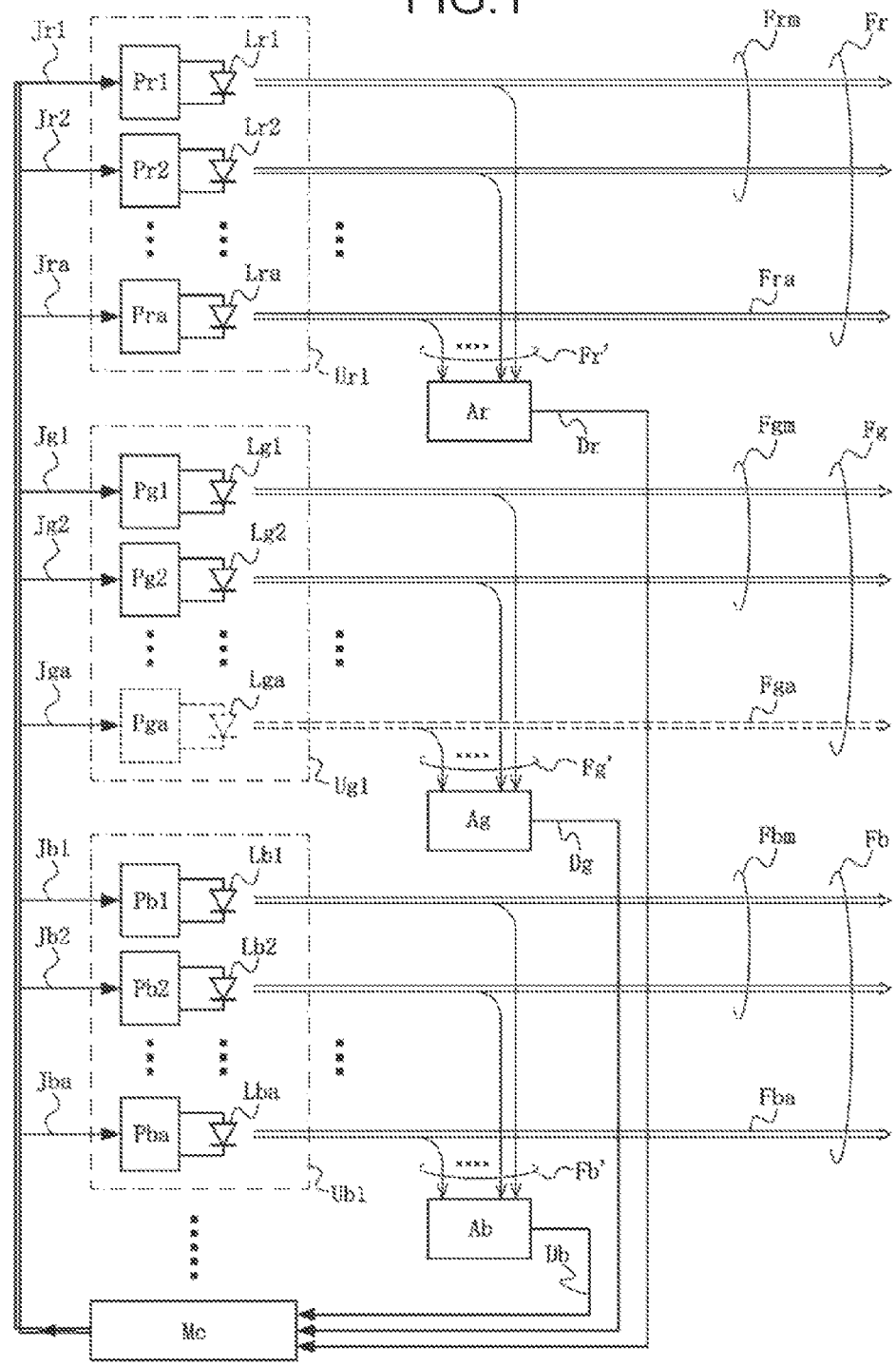
FIG. 1 is a block diagram illustrating a light source unit according to an embodiment of the invention in a simplified manner.

First, an embodiment of the invention is described with reference to FIG. 1 that is a block diagram illustrating a light source unit according to an embodiment of the invention in a simplified manner. An elemental light source (Ur1) for R-color includes light emitting elements (Lr1, Lr2, . . . ) of R-color that are configured to generate main component light (Frm) and a light emitting element (Lra) of G-color that is configured to generate additional light (Fra). The main component light (Frm) and the additional light (Fra) are mixed, and resultant light is output as one R-color output luminous flux (Fr) from the light source unit. Note that each of the light emitting elements (Lr1, Lr2, . . . Lra) described above, and light emitting elements (Lg1, Lg2, . . . Lra, Lb1, Lb2, . . . Lba, . . . ) to be described later may be configured of, for example but not limited to, a single light source, a plurality of light sources coupled in series, a plurality of light sources coupled in parallel, or a plurality of units that are coupled in series and each of which includes a plurality of light sources coupled in parallel. An example of the light source used here may be a semiconductor laser or a light source that converts, for example, a wavelength of semiconductor laser or radiated light of a semiconductor laser with use of non-linear optical phenomenon such as harmonic generation and optical parametric effect. In a case where the light emitting elements are each configured of a plurality of light sources, the respective light sources included in the light emitting elements may be driven by common drive circuits (Pr1, Pr2, . . . , Pra).

The light emitting elements (Lr1, Lr2, . . . , Lra) are driven by the drive circuits (Pr1, Pr2, . . . Pra). Each of the drive circuits (Pr1, Pr2, . . . , Pra) may be a DC/DC converter that is fed with power by a DC power source (not illustrated) and configured of, for example, a step-down chopper circuit or a step-up chopper circuit. The drive circuits (Pr1, Pr2, . . . , Pra) supply predetermined power to the respective light emitting elements (Lr1, Lr2, . . . , Lra). A control circuit (Mc) independently controls the drive circuits (Pr1, Pr2, . . . , Pra) through respective drive circuit control signals (Jr1, Jr2, . . . , Jra) to supply the predetermined power to the respective light emitting elements (Lr1, Lr2, . . . , Lra).

A measurement-use output luminance flux (Fr') is generated from the R-color output luminous flux (Fr) by a method such as branching part of the R-color output luminance flux (Fr) with use of, for example, a beam splitter. The measurement-use output luminous flux (Fr') enters an R-color luminous flux characteristic measurement means (Ar). The R-color luminous flux characteristic measurement means (Ar) generates luminous flux chromaticity-intensity correlation data (Dr) correlated with chromaticity coordinates and intensity of the R-color output luminous flux (Fr), and transmits the luminous flux chromaticity-intensity correlation data (Dr) to the control circuit (Mc). Regarding the R-color output luminous flux (Fr), an optical system such as a collimator lens may be interposed on an as-needed basis, and matching of luminous flux form such as conversion of the R-color output luminous flux (Fr) into a luminous flux toward an infinite image may be so performed by the optical system as to be adapted to application of light; however, illustration of such an optical system is omitted.

The light source unit according to the embodiment of the invention includes an elemental light source (Ug1) for G-color and an elemental light source for B-color (Ub1) in addition to the elemental light source (Ur1) for R-color. The elemental light source (Ug1) for G-color includes G-color light emitting elements (Lg1, Lg2, . . . ) configured to generate main component light (Fgm), and the elemental light source (Ub1) for B-color includes B-color light emitting elements (Lb1, Lb2, . . . ) configured to generate main component light (Fbm). The elemental light source (Ug1) for G-color and the elemental light source (Ug1) for B-color respectively generate a G-color output luminous flux (Fg) and a B-color output luminous flux (Fb). In particular, the elemental light source (Ub1) for B-color further includes a G-color light emitting element (Lba) configured to generate additional light (Fba) similarly to the R-color elemental light source (Ur1). The additional light (Fba) is mixed with the main component light (Fbm).

These elemental light sources include drive circuits (Pg1, Bg2, . . . , Pb1, Pb2, . . . , Pba, . . . ) driving the light emitting elements (Lg1, Lg2, . . . , Lb1, Lb2, . . . , Lba, . . . ) similarly to the elemental light source (Ur1). The control circuit (Mc) independently controls the drive circuits (Pg1, Pg2, . . . , Pb1, Pb2, . . . Pba, . . . ) through respective drive circuit control signals (Jg1, Jg2, . . . , aJb1, Jb2, . . . , Jba, . . . ) to supply predetermined power to the respective light emitting elements (Lg1, Lg2, . . . , Lb1, Lb2, . . . , Lba, . . . ). Regarding the G-color output luminous flux (Fg) and the B-color output luminous flux (Fb), matching of luminous flux form is performed, and thereafter, part of the G-color output luminous flux (Fg) and part of the B-color output luminous flux (Fb) are branched to generate measurement-use output luminous fluxes (Fg', Fb'). The measurement-use output luminance fluxes (Fg', Fb') respectively enter a G-color luminous flux characteristic measurement means (Ag) and a B-color luminous flux characteristic measurement means (Ab). The respective luminous flux characteristic measurement means generate luminous flux chromaticity-intensity correlation data (Dg, Db) correlated with chromaticity coordinates and intensity of respective luminous fluxes, and transmit the luminous flux chromaticity-intensity correlation data (Dg, Db) to the control circuit (Mc).

For example, in the case of the above-described projector, the R-color output luminous flux (Fr), the G-color output luminous flux (Fg), and the B-color output luminous flux (Fb) may be used so as to illuminate a two-dimensional light intensity modulator provided independently for each of colors R, G, and B and as to perform color synthesis of modulated luminous fluxes of the three primary colors R, G, and B with use of a disposed dichroic mirror or a disposed dichroic prism.

Figure 2:
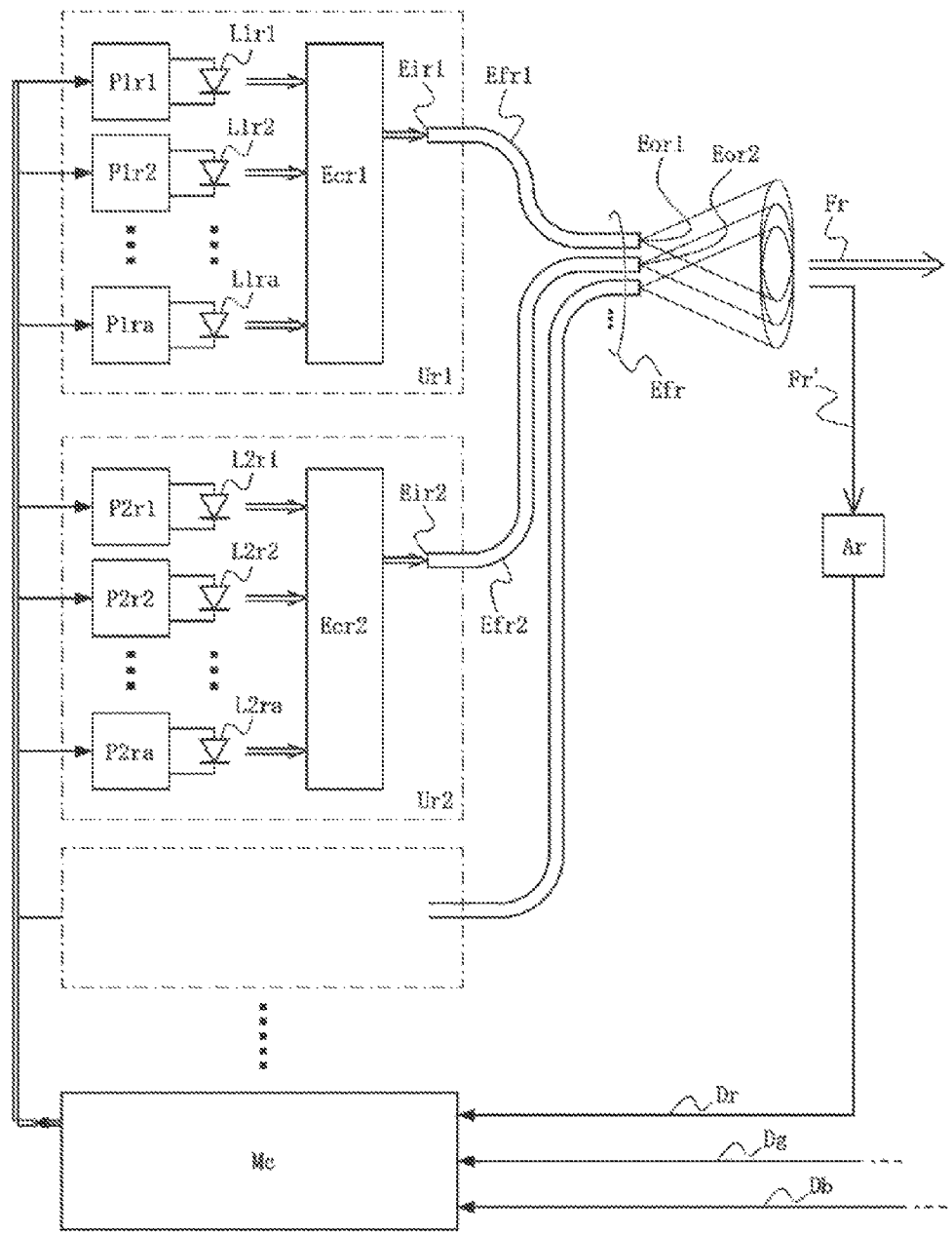
FIG. 2 is a block diagram illustrating a light source unit according to an embodiment of the invention in a simplified manner.

Alternatively, as illustrated in FIG. 2 that is a block diagram illustrating a light source unit according to an embodiment of the invention, a light source unit may be configured with use of optical fibers. This diagram mainly illustrates only part where the R-color output luminous flux (Fr) is generated, and part where the G-color output luminous flux and the B-color output luminous flux are generated is omitted. Each of elemental light sources for R-color (Ur1, Ur2, . . . ) includes light emitting elements (L1r1, L1r2, . . . , L1ra, L2r1, L2r2, . . . , L2ra, . . . ) and drive circuits (P1r1, P1r2, . . . , P1ra, P2r1, P2r2, . . . , P2ra, . . . ) respectively corresponding thereto. In this example, light emitted from the light emitting elements (L1r1, L1r2, . . . , L1ra, L2r1, L2r2, . . . , L2ra, . . . ) may be focused on incident ends (Eir1, Eir2, . . . ) of respective optical fibers (Efr1, Efr2, . . . ) by focusing optical systems (Ecr1, Ecr2, . . . ) each configured of, for example, a lens, and focused light propagates through cores of the respective optical fibers (Efr1, Efr2, . . . ) so as to be radiated from the exit ends (Eor1, Eor2, . . . ).

The radiated light from the exit ends (Eor1, Eor2, . . . ) of the respective optical fibers (Efr1, Efr2, . . . ) of the respective elemental light sources (Ur1, Ur2, . . . ) are integrated, and integrated light is output from the light source unit according to the embodiment of the invention, as a single R-color output luminous flux (Fr). To integrate the radiated light from the plurality of exit ends (Eor1, Eor2, . . . ), exit ends of the respective optical fibers (Efr1, Efr2, . . . ) are bundled such that the exit ends (Eor1, Eor2, . . . ) are aligned so as to be positioned on the same plane to configure a fiber bundle (Efr), that is the simplest way. To measure a quantity correlated with light intensity of the R-color output luminous flux (Fr) that is guided by each of the optical fibers (Efr1, Efr2, . . . ), the measurement-use output luminous flux (Fr') that is formed by integrating extracted parts of the respective radiated light from the respective output ends (Eor1, Eor2, . . . ) is generated, and the measurement-use output luminous flux (Fr') enters the R-color luminous flux characteristic measurement means (Ar).

Note that the case where one R-color luminous flux characteristic measurement means (Ar) is provided for the integrated R-color output luminous flux (Fr) from the elemental light sources (Ur1, Ur2, . . . ) is described here; however, as illustrated in FIG. 1, a luminous flux characteristic measurement means may be provided for each elemental light source. More specifically, providing the luminous flux characteristic measurement means for each elemental light source is achievable by branching a measurement-use output luminous flux at a position immediately before or immediately after the focusing optical systems (Ecr1, Ecr2, . . . ) in FIG. 2 and allowing the measurement-use output luminous flux to enter the luminous flux characteristic measurement means.

Hereinafter, description is given of the R-color luminous flux characteristic measurement means (Ar), the G-color luminous flux characteristic measurement means (Ag), and the B-color luminous flux characteristic measurement means (Ab) that generate luminous flux chromaticity-intensity correlation data (Dr, Dg, Db) that are respectively correlated with chromaticity coordinates and intensity of the R-color output luminous flux (Fr), the G-color output luminous flux (Fg), and the B-color output luminous flux (Fb).

Typically, the color of light emitted from, for example, a light source is represented by chromaticity coordinate based on XYZ color system recommended by CIE (The Japan Society of Applied Physics/The Optical Society of Japan "Characteristics and Technologies of Color" first impression of first edition, Oct. 10, 1986, published by Asakura Publishing Co., Ltd.). The tristimulus values X, Y, and Z of the luminous flux to be measured represented by spectrum $S(\lambda)$ having the wavelength $\lambda$ as a parameter are determined by integration of the following expressions (expression 1), with use of the color matching functions xe(λ), ye(λ), and ze(λ) defined by CIE. Incidentally, the integration is performed in a region of wavelength from about 380 nm to about 780 nm.

$$X = \int S(\lambda) \cdot xe(\lambda) \cdot d\lambda$$

$$Y = \int S(\lambda) \cdot ye(\lambda) \cdot d\lambda$$

$$Z = \int S(\lambda) \cdot ze(\lambda) \cdot d\lambda \quad \text{(Expression 1)}$$

With use of the tristimulus values X, Y, and Z, the chromaticity coordinates x and y of the luminous flux to be measured S(λ) are determined by the following expressions (expression 2).

$$x = X/\{X+Y+Z\}$$

$$y = Y/\{X+Y+\} \quad \text{(Expression 2)}$$

Moreover, the intensity I of the luminous flux to be measured may be determined by the following expression (expression 3).

$$I = \int S(\lambda) \cdot d\lambda \quad \text{(Expression 3)}$$

The color matching functions xe(λ), ye(λ), and ze(λ) have the characteristics illustrated in FIG. 3 that is a schematic diagram of concept relating to the technology of the light source unit according to the embodiment of the invention. Incidentally, although symbols of characters x, y, and z attached with upper horizontal line are used in the color matching function in general documents, the symbols of the color matching functions in the present specification are denoted as described above for certain reasons.

In the present specification, various quantities such as the tristimulus values X, Y, and Z and the chromaticity coordinates x and y based on the above-described XYZ color system are mainly used, and a light source unit that adjusts these values to desired values is described; however, in the configuration of an actual light source unit, it is not necessary to faithfully use these quantities, and quantities correlated with the quantities or alternative quantities may be used. Moreover, the various quantities may be based on any other color system that is allowed to specify the color of light, for example, the RGB color system or the u'v' color system.

After all, the luminous flux chromaticity-intensity correlation data (Dr, Dg, Db) respectively correlated with chromaticity coordinates and intensity of the R-color output luminous flux (Fr), the G-color output luminous flux (Fg), and the B-color output luminous flux (Fb) may be data by which a spectrum Sr(λ) of the R-color output luminous flux (Fr), a spectrum Sg(λ) of the G-color output luminous flux (Fg), and a spectrum Sb(λ) of the B-color output luminous flux (Fb) are determined.

In the light source unit according to the embodiment of the invention, the light emitting elements (Lr1, Lr2, . . . , Lra, Lg1, Lg2, . . . ) each emit light of a narrow wavelength band. To determine the spectrums Sr(λ), Sg(λ), and Sb(λ) of the R-color output luminous flux (Fr), the G-color output luminous flux (Fg), and the B-color output luminous flux (Fb), for example, deviation from normal wavelength and intensity of the main component light (Frm, Fgm, Fbm) of respective output luminous flux may be measured as the luminous flux chromaticity-intensity correlation data (Dr, Dg, Db). Moreover, in a case where the R-color output luminous flux (Fr), the G-color output luminous flux (Fg), and the B-color output luminous flux (Fb) are generated by mixing the additional light (Fra, Fga, Fba), the intensity of the additional light (Fra, Fga, Fba) may be also measured as the luminous flux chromaticity-intensity correlation data (Dr, Dg, Db).

As described above, deviation from normal wavelength of the additional light (Fra, Fga, Fba) may not be measured. The reason for this is that the intensity of the additional light (Fra, Fga, Fba) is sufficiently weak, as compared with the main component light (Frm, Fgm, Fbm), and extremely small deviation from normal wavelength of the additional light (Fra, Fga, Fba) is an extremely small second-order quantity in contribution to values of the chromaticity coordinates, and is generally ignored.

FIG. 4 is a schematic diagram illustrating so-called chromaticity diagram that illustrates relationship between chromaticity coordinates and colors. All of colors representable in the color system are located on or inside a dashed line in FIG. 4. In FIG. 4, schematic positions of red (R), green (G), blue (B), and white (W) are illustrated. Here, a U-shaped curve from B to R via G in the dashed line in the figure is called spectrum locus, and single-color light such as a laser beam is located on the dashed line in the spectrum locus. Note that a straight line from R to B is so-called pure purples, and is created by mixture of the color B and the color R. The chromaticity coordinates of pure white are ⅓ and ⅓.

Assuming that, as the light emitting elements mounted in the light source unit, semiconductor lasers with a R wavelength of about 640 nm, a G wavelength of about 532 nm, and a B wavelength of 465 nm (for the colors R and B) and a second harmonic light source (for the color G) are used, these colors are represented by chromaticity coordinate points (cr, cg, cb) in the chromaticity diagram. A color reproduction region by the light source unit is a shaded region inside a triangle having the chromaticity coordinate points (cr, cg, cb) as apexes in the figure.

In a case where the wavelength of the light emitting elements (Lr1, Lr2, . . . ) of R-color that generates the main component light (Frm) of the R-color output luminous flux (Fr) is varied with, for example, the above-described temperature variation, the chromaticity coordinate point (cr) of the main component light (Frm) moves closer to or away from the chromaticity coordinate point (cg) of G-color on the dashed line in the spectrum locus where the chromaticity coordinate point (cr) is located. Therefore, for example, in a case where a condition for moving the chromaticity coordinate point (cr) closest to the chromaticity coordinate point (cg) is set as a reference chromaticity coordinate condition, if the color of the light emitting elements (Lr1, Lr2, . . . ) of R-color is located at a position farther from the chromaticity coordinate point (cg) than the reference condition, the light emitting element (Lra) of G-color that generates the additional light (Fra) of the R-color output luminous flux (Fr) emits light by power having an appropriate ratio to power supplied to the light emitting elements (Lr1, Lr2, . . . ) of R-color to mix the additional light (Fra) into the main component light (Frm). Thus, the chromaticity coordinate point (cr) of the R-color output luminous flux (Fr) is allowed to be maintained at the reference chromaticity coordinate condition.

In a case where the wavelength of the light emitting elements (Lb1, Lb2, . . . ) of B-color that generates the main component light (Fbm) of the B-color output luminous flux (Fb) is varied in a similar manner, the chromaticity coordinate point (cb) of the main component light (Fbm) moves closer to or away from the chromaticity coordinate point (cg) of G-color on the dashed line in the spectrum locus where the chromaticity coordinate point (cb) is located.

Therefore, for example, in a case where a condition for moving the chromaticity coordinate point (cb) closest to the chromaticity coordinate point (cg) is set as a reference chromaticity coordinate condition, if the color of the light emitting element (Lb1, Lb2, . . . ) of B-color is located at a position farther from the chromaticity coordinate point (cg) than the above-described reference condition, the light emitting element (Lba) of G-color that generates the additional light (Fba) of the B-color output luminous flux (Fb) emits light by power having an appropriate ratio to power supplied to the light emitting elements (Lb1, Lb2, . . . ) of B-color to mix the additional light (Fba) into the main component light (Fbm). Thus, the chromaticity coordinate point (cb) of the B-color output luminous flux (Fb) is allowed to be maintained at the above-described reference coordinate condition.

The direction of the dashed line in the spectrum locus in proximity to the chromaticity coordinate point (cr) of R-color substantially coincides with a direction joining the chromaticity coordinate point (cr) and the chromaticity coordinate point (cg) of G-color, but the direction of the dashed line in the spectrum locus in proximity to the chromaticity coordinate point (cb) has a certain angle with a direction joining the chromaticity coordinate point (cb) and the chromaticity coordinate point (cg) of G-color. Regarding the R-color output luminous flux (Fr), when the power supplied to the light emitting element (Lra) of G-color is so adjusted as to make only the y-coordinate of the chromaticity coordinate point (cr) as one of the chromaticity coordinates equal to the y-coordinate in the above-described reference chromaticity coordinate condition, the y-coordinate and the x-coordinate are maintained at the above-described reference coordinate condition at favorable accuracy. Regarding the B-color output luminous flux (Fb), when the power supplied to the light emitting element (Lba) of G-color is so adjusted as to make only the y-coordinate of the chromaticity point (cb) as one of the chromaticity coordinates equal to the y-coordinate in the above-described reference chromaticity coordinate condition, the y-coordinate is maintained at the above-described reference chromaticity coordinate condition, but the x-coordinate may have some error in the strict sense. However, the adjustment method described above is practically sufficient.

Regarding the R-color output luminous flux (Fr), since the dashed line in the spectrum locus and the direction joining the chromaticity coordinate point (cr) and the chromaticity coordinate point (cg) of G-color have a gradient of about 45 degrees with respect to an x axis in proximity to the chromaticity coordinate point (cr), the x-coordinate is correlated with the y-coordinate. Accordingly, only the x-coordinate of the chromaticity coordinate point (cr) may be so adjusted as to be equal to the x-coordinate in the reference chromaticity condition. Regarding the B-color output luminous flux (Fb), since the dashed line in the spectrum locus and the direction joining the chromaticity coordinate point (cb) and the chromaticity coordinate point (cg) of G-color are substantially directed to the direction of the y axis, as described above, the y-coordinate of the chromaticity coordinate point (cb) may be preferably so adjusted as to be equal to the y-coordinate in the reference chromaticity coordinate condition.

Note that the y-coordinate of the chromaticity coordinate point (cr) and the y-coordinate of the chromaticity coordinate point (cb) may be determined as single-color color-phase indicating values by calculation faithful to the expression 2. Alternatively, for the convenience of calculation, an alternative quantity correlated with each of the y-coordinate of the chromaticity coordinate point (cr) and the y-coordinate of the chromaticity coordinate point (cb) may be generated, and the ratio of intensity of the additional light to intensity of the main component light may be determined so that the alternate quantity becomes equal to a target value.

To determine the ratio, in a state in which the R-color output luminous flux (Fr), the G-color output luminous flux (Fg), and the B-color output luminous flux (Fb) are generated, based on the luminous flux chromaticity-intensity correlation data (Dr and Db) generated by the R-color luminous flux characteristic measurement means (Ar) and the B-color luminous flux characteristic measurement means (Ab), while the single-color color-phase indicating values of the chromaticity coordinate point (cr) of R-color and the chromaticity coordinate point (cb) of B-color are monitored, the control circuit (Mc) may perform feedback control, as will be described later, on output power of the drive circuit (Pra) and the drive circuit (Pba) so that the respective single-color color-phase indicating values become equal to respective target values thereof. The drive circuit (Pra) drives the light emitting element (Lra) of G-color that emits the additional light (Fra) of the R-color output luminous flux (Fr). The drive circuit (Pba) drives the light emitting element (Lba) of G-color that emits the additional light (Fba) of the B-color output luminous flux (Fb). Alternatively, as will be described later, the ratio may be determined by calculation in place of feedback control.

Even if the ratio of the intensity of the additional light to the intensity of the main component light in each of the R-color output luminous flux (Fr) and the B-color output luminous flux (Fb) is determined, as described above, so that the chromaticity coordinate point (cr) and the chromaticity coordinate point (cb) are maintained at the reference chromaticity coordinate condition, or more practically, so that the single-color color-phase indicating values become equal to the target values, additional control is necessary to determine color of integrated light of the R-color output luminous flux (Fr), the G-color output luminous flux (Fg), and the B-color output luminous flux (Fb). Therefore, the control circuit (Mc) generates an integrated color-phase indicating value correlated with integrated chromaticity coordinates of the R-color output luminous flux (Fr), the G-color output luminous flux (Fg), and the B-color output luminous flux (Fb), based on the luminous flux chromaticity-intensity correlation data (Dr, Dg, Db) generated by the R-color luminous flux characteristic measurement means (Ar), the G-color luminous flux characteristic measurement means (Ag), and the B-color luminous flux characteristic measurement means (Ab), and the control circuit (Mc) performs feedback control on the drive circuits (Pr1, Pr2, . . . , Pra, Pg1, Pg2, . . . , Pb1, Pb2, . . . , Pba, . . . ) for the R-color output luminous flux (Fr), the G-color output luminous flux (Fg), and the B-color output luminous flux (Fb), while maintaining the ratio, to allow a difference between the integrated color-phase indicating value and a target value thereof to be small.

Integrated chromaticity coordinates x and y of the R-color output luminous flux (Fr), the G-color output luminous flux (Fg), and the B-color output luminous flux (Fb) may be determined as the integrated color-phase indicating value by calculation faithful to the expression 2. Alternatively, for the convenience of calculation, an alternative quantity correlated with chromaticity coordinates may be generated, and control may be performed to allow a difference between the alternative quantity and a target value thereof to be small.

Brief description is given of feedback control to allow the difference between the integrated chromaticity coordinates x and y of the R-color output luminous flux (Fr), the G-color output luminous flux (Fg), and the B-color output luminous flux (Fb) as the integrated color-phase indicating values and the target values thereof to be small. It is assumed that the target values of the chromaticity coordinates are set close to white. The control circuit (Mc) calculates the chromaticity coordinates, based on the luminous flux chromaticity-intensity correlation data (Dr, Dg, Db) acquired from the R-color output luminous flux (Fr), the G-color output luminous flux (Fg), and the B-color output luminous flux (Fb), and compares the values x and y of the calculated chromaticity coordinates with the target values thereof.

In FIG. 4, when the position of white is viewed as a reference, R, G, and B are substantially located on right side, upper side, and lower side, respectively. Therefore, in the chromaticity coordinates of the white light, the value x increases with the increase of R component, the value y increases with the increase of G component, and the value y decreases with the increase of B component It is therefore found that, for example, when the value x is larger than the target value, the control circuit (Mc) may decrease the total output power Ptr of the drive circuits driving the light emitting elements that generate the R-color output luminous flux (Fr), out of the drive circuits (Pr1, Pr2, . . . , Pra, Pg1, Pg2, . . . , Pb1, Pb2, . . . , Pba) by p %, and may increase each of the total output power Ptg of the drive circuits driving the light emitting elements that generate the G-color output luminous flux (Fg) and the total output power Ptb of the drive circuits driving the light emitting elements that generate the B-color output luminous flux (Fb) by [p/2]%, through the drive circuit control signals (Jr1, Jr2, . . . , Jra, Jg1, Jg2, . . . , Jb1, Jb2, . . . , Jba). Also, it is found that, when the value y is larger than the target value, the control circuit (Mc) may decrease the total output power Ptg by q % and may increase the total output power Ptb by q %, through the drive circuit control signals (Jr1, Jr2, . . . , Jra, Jg1, Jg2, . . . , Jb1, Jb2, . . . , Jba, . . . ). Then, after appropriate length of time is elapsed, the sequence is returned to a step of acquiring the light intensity measurement data again, to establish the feedback control loop. By the feedback control loop, the control is constantly performed so that the difference between the chromaticity coordinates and the target values thereof is small with less variation of light intensity. This makes it possible to stabilize the color of light.

Incidentally, when the value x or the value y is smaller than the target value, the operation of increase and the operation of decrease as described above are reversed. In addition, the value p and the value q should be small values not causing drastic variation of the color of light. The relationship between the value p with respect to the difference between the value x and the target value thereof and the value q with respect to the difference of the value y and the target value thereof may be preferably determined experimentally. Note that the increase and decrease of the output power based on the value p and the increase and decrease of the output power based on the value q may be alternately performed. Alternatively, after the values p and q are determined, the increase and decrease of the output power reflecting the both values p and q may be performed.

The method of increasing and decreasing the total output power Ptr, Ptg, and Ptb is not necessarily a method of approaching the target values through the shortest route, but is a method through trial and error. However, since the state of the system may be gradually changed toward the target values by the feedback control, the above-described method is sufficiently practical. Incidentally, the method of approaching the target values through the shortest route will be described later.

The chromaticity coordinates corresponding to pure white is not necessarily favorable as the target chromaticity coordinates. This is because, for example, when the light source unit according to the embodiment of the invention is applied to a projector, usage efficiency of light of an optical system in the projector is not necessarily the same in colors R, G, and B. For example, if the usage efficiency of B-color is low in the optical system in a projector, the target chromaticity coordinates may become bluish chromaticity coordinates including extra B-color component. Accordingly, the target chromaticity coordinates may be determined not based on the integrated color of the R-color output luminous flux (Fr), the G-color output luminous flux (Fg), and the B-color output luminous flux (Fb) of the light source unit but on the output of an apparatus that uses the light source unit.

Here, property in which the total output power Ptr, Ptg, or Ptb of the drive circuits driving the light emitting elements that generate output luminous flux of one color and the light intensity of the output luminous flux of the one color are substantially proportionally correlated with each other is used (in the specification, the property is called electric power and light intensity proportion rule). More specifically, property in which, out of the drive circuits (Pr1, Pr2, . . . , Pra, Pg1, Pg2, . . . , Pb1, Pb2, . . . , Pba), the total output power Ptr of the drive circuits driving the light emitting elements that generate the R-color output luminous flux (Fr), the total output power Ptg of the drive circuits driving the light emitting elements that generate the G-color output luminous flux (Fg), and the total output power Ptb of the drive circuits driving the light emitting elements that generate the B-color output luminous flux (Fb) are substantially proportionally correlated respectively with the light intensity of the R-color output luminous flux (Fr), the G-color output luminous flux (Fg), and the B-color output luminous flux (Fb) is used. As the premise thereof, it is assumed that the light emitting elements (Lr1, Lr2, . . . , Lra, Lg1, Lg2, . . . , Lb1, Lb2, . . . , Lba) emitting the same color light have the same emission efficiency (more pragmatically, the same kind of products by the same manufacturer) although the emission efficiency may be different between the light emitting elements emitting different color light. There is a case where the above-described premise is not applied due to the fact that a plurality of light emitting elements different in emission efficiency are mixed although the light emitting elements emit the same color light. For example, it is assumed that there are light emitting elements of a kind A that are high in emission efficiency and light emitting elements of a kind B that are lower in emission efficiency by 10% than the light emitting elements of the kind A. When receiving power setting instruction from the control circuit (Mc) through the drive circuit control signals (Jr1, Jr2, . . . , Jra, Jg1, Jg2, . . . , Jb1, Jb2, . . . , Jba), the drive circuits driving the light emitting elements of the kind B internally set the power larger by 10% than the instructed setting power, or any other structural way is contrived to easily address the case.

Note that proportional accuracy in the above-described electric power and light intensity proportion rule, namely, linearity does not a matter. This is because it is possible to gradually change the state of the system toward the target values through the feedback control by gradually varying the power as long as the increase of the power and the increase of the light intensity are correlated with each other even if the linear relationship therebetween is not established.

Further, if there are a plurality of target drive circuits when varying the total output power Ptr, Ptg, and Ptb of the drive circuits driving the light emitting elements that generate the output luminous flux of the one color, all of the drive circuits may be changed at the same rate or different rates, or only specified drive circuits may be varied. The power setting to the drive circuit is limited in level. For example, when the setting data length is 8 bits, the grayscale is 256. Therefore, when the power is increased by minimum unit, the power setting of all of the drive circuits are not increased by 1LSB at a time. The power setting of the drive circuits are separately increased in such a manner that, for example, the power setting of a first drive circuit is increased by 1LSB, then the power setting of a second drive circuit is increased by 1LSB, and when the power setting of a final drive circuit is increased by 1LSB, the power setting of the first drive circuit is increased again by 1LSB, and the increase is continued. As a result, it is advantageously possible to increase the number of grayscale of the power setting to multiple of the number of the drive circuits.

It is necessary to increase or decrease the total output power while maintaining the ratio of the intensity of the additional light to the intensity of the main component light at the determined value. It is therefore necessary to determine the setting data length, namely, bit length of the drive circuit driving the light emitting element that generates additional light so that the total power of the main component light forming an output luminous flux of one color and the total power of the additional light are substantially the same in control level, namely, dynamic range. For example, in a case where there are 10 elemental light sources for the main component light forming an output luminous flux of one color and one elemental light source for additional light, and the setting data length of each of the drive circuits for the main component light is 8 bits, it may be necessary to set the setting data length of the drive circuit for the additional light to, for example, 12 bits.

As described above, according to the embodiment of the invention, it is possible to stabilize both the color of light necessary for the R-color output luminous flux (Fr), the G-color output luminous flux (Fg), and the B-color output luminous flux (Fb) and the color of integrated light of the R-color output luminous flux (Fr), the G-color output luminous flux (Fg), and the B-color output luminous flux (Fb) by the above-described way of controlling the power of the drive circuits (Pr1, Pr2, . . . , Pra, Pg1, Pg2, . . . ) only by adding, for the R-color output luminous flux (Fr), the light emitting element (Lra) of G-color for mixing the additional light (Fra) and adding, for the B-color output luminous flux (Fb), the light emitting element (Lba) of G-color for mixing the additional light (Fba).

The XYZ color system recommended by CIE is configured such that the value Y in the expression 1 represents the brightness of the integrated light of all of the included wavelength bands. Accordingly, when the brightness of the integrated light of the R-color output luminous flux (Fr), the G-color output luminous flux (Fg), and the B-color output luminous flux (Fb) is also stabilized in addition to the color-phase indicating values correlated with the color of light, the control circuit (Mc) may compare the calculated value Y as the brightness indicating value with the target value. When the value Y is larger than the target value, according to the electric power and light intensity proportion rule, the control circuit (Mc) decreases, out of the drive circuits (Pr1, Pr2, . . . , Pra, Pg1, Pg2, . . . , Pb1, Pb2, . . . , Pba), each of the total output power Ptr of the drive circuits driving the light emitting elements that generate the R-color output luminous flux, the total output power Ptg of the drive circuits driving the light emitting elements that generate the G-color output luminous flux (Fg), and the total output power Ptb of the drive circuits driving the light emitting elements that generate the B-color output luminous flux (Fb), by Q % through the drive circuit control signals (Jr1, Jr2, . . . , Jra, Jg1, Jg2, . . . , Jb1, Jb2, . . . , Jba). As a result, it is possible to stabilize the brightness of light without varying the color of light by performing the feedback control in a direction in which the difference between the brightness of light and the target value becomes small.

Incidentally, if the value Y is smaller than the target value, the operation of increase and the operation of decrease described above are reversed. Further, the value Q should be a small value not causing drastic variation of the brightness of light. The relationship of the value Q to the difference between the value Y and the target value thereof may be preferably determined experimentally. The increase and decrease of the output power to stabilize the brightness of light described here and the increase and decrease of the output power to stabilize the color of light may be alternately performed. Alternatively, after the values p, q, and Q are each determined, the increase and decrease of the output power reflecting the three values may be performed.

In the detection of the difference between the chromaticity coordinates x and y and the brightness of light Y and the respective target values, the method of increasing and decreasing the total output power Ptr, Ptg, and Ptb based on the values q, p, and Q is not necessarily a method of approaching the target values through the shortest route, but is a method through trial and error. However, since the state of the system may be gradually changed toward the target values by the feedback control, the above-described method is also sufficiently practical. Incidentally, the method of approaching the target values through the shortest route will be described later.

In the light source unit described above, it is not necessary to generate the G-color output luminous flux (Fg) by mixing additional light into the main component light (Fgm) from the light emitting elements (Lg1, Lg2, . . . ) of G-color. This is because when slight color variation occurs, human ability to distinguish such slight color variation differs depending on position of chromaticity coordinates, and the size of a region where variation is indistinguishable, namely, the size of a MacAdam color-matching ellipse is large in the vicinity of G-color. In other words, even if the G-color output luminous flux (Fg) is slightly varied in wavelength, humans are not allowed to distinguish such slight variation (Japan Color Research Institute "Fundermentals and Applications of Color Matching", Nov. 30, 1991, published by the Nikkan Kyogo Shimbun, Ltd., p. 46 FIG. 4.1 "Result of Color Discrimination Experiment by MacAdam (JOSA 32 1942)").

When variation in wavelength of the G-color output luminous flux is large, such variation is distinguishable. Accordingly, in the light source unit, it may be desirable to prevent variation in the chromaticity coordinates by mixing additional light for the G-color output luminous flux (Fg). To achieve this, it is necessary to select the color of mixed additional light (Fga) according to the wavelength of the main component light (Fgm).

In a first case in which the chromaticity coordinates of the main component light (Fgm) are located on the dashed line in the substantially linear spectrum locus linked to the chromaticity coordinate point (cr) of R-color similarly to the chromaticity coordinate point (cg) in FIG. 4, light from the light emitting element (Lga) of R-color may be preferably mixed as the additional light (Fga). In a second case in which the chromaticity coordinates of the main component light (Fgm) are located on the dashed line in the substantially linear spectrum locus linked to the chromaticity coordinate point (cb) of B-color similarly to the chromaticity coordinate point (cg') in FIG. 4, light from the light emitting element (Lga) of B-color may be preferably mixed as the additional light (Fga). In a third case in which the chromaticity coordinates of the main component light (Fgm) are located on a curve in the vicinity of an apex of the dashed line in the spectrum locus similarly to the chromaticity coordinate point (cg"), both the light emitting element of R-color and the light emitting element of B-color may be preferably provided, and light from either of the light emitting element of R-color and the light emitting element of B-color may be preferably mixed as additional light (Fga). Note that wavelength ranges of the main component light (Fgm) corresponding to the first case, the second case, and the third case may be respectively a range of about 520 nm or larger, a range of about 515 nm or smaller, and a range of about 510 nm to about 525 nm both inclusive. Any of the cases may be applied to wavelengths in a region where the above-described wavelength ranges overlap each other.

For example, in the first case, as with the above-described case in which the chromaticity coordinate point (cr) of the R-color output luminous flux (Fr) is maintained at the reference chromaticity coordinate condition, when the wavelength of the light emitting elements (Lg1, Lg2, . . . ) of G-color that generate the main component light (Fgm) of the G-color output luminous flux (Fg) is varied with, for example, temperature variation, the chromaticity coordinate point (cg) of the main component light (Fgm) moves closer to or away from the chromaticity coordinate point (cr) of R-color on the dashed line in the spectrum locus where the chromaticity coordinate point (cg) is located. Therefore, for example, in a case where a condition for moving the chromaticity coordinate point (cg) closest to the chromaticity coordinate point (cr) is set as a reference chromaticity coordinate condition, if the color of the light emitting elements (Lg1, Lg2, . . . ) of G-color is located at a position farther from the chromaticity coordinate point (cr) than the reference condition, the light emitting element (Lga) of R-color that generates the additional light (Fga) of the G-color output luminous flux (Fg) emits light by power having an appropriate ratio to power supplied to the light emitting elements (Lg1, Lg2, . . . ) of G-color to mix the additional light (Fga) into the main component light (Fgm). Thus, the chromaticity coordinate point (cg) of the G-color output luminous flux (Fg) is allowed to be maintained at the reference chromaticity coordinate condition.

In this case, the direction of the dashed line in the spectrum locus in proximity to the chromaticity coordinate point (cg) substantially coincides with a direction joining the chromaticity coordinate point (cg) and the chromaticity coordinate point (cr) of R-color. Accordingly, when the power supplied to the light emitting element (Lga) of R-color is so adjusted as to make only the y-coordinate of the chromaticity coordinate point (cg) as one of the chromaticity coordinates equal to the y-coordinate in the above-described reference chromaticity coordinate condition, the y-coordinate and the x-coordinate are maintained at the reference chromaticity coordinate condition at favorable accuracy. Since the direction of the dashed line in the spectrum locus and the direction joining the chromaticity coordinate point (cg) and the chromaticity coordinate point (cr) of R-color have a gradient of about 45 degrees with respect to the x axis in proximity to the chromaticity coordinate point (cg), the x-coordinate is correlated with the y-coordinate. Accordingly, only the x-coordinate of the chromaticity coordinate point (cg) may be so adjusted as to be equal to the x-coordinate in the reference chromaticity condition.

Moreover, in the second case, when the wavelength of the light emitting elements (Lg1, Lg2, . . . ) of G-color that generate the main component light (Fgm) of the G-color output luminous flux (Fg) is varied, the chromaticity coordinate point (cg') of the main component light (Fgm) moves closer to or away from the chromaticity coordinate point (cb) of B-color on the dashed line in the spectrum locus where the chromaticity coordinate point (cg') is located. Therefore, for example, in a case where a condition for moving the chromaticity coordinate point (cg') closest to the chromaticity coordinate point (cb) is set as a reference chromaticity coordinate condition, if the color of the light emitting elements (Lg1, Lg2, . . . ) of G-color is located at a position farther from the chromaticity coordinate point (cb) than the reference condition, the light emitting element (Lga) of B-color that generates the additional light (Fga) of the G-color output luminous flux (Fg) emits light by power having an appropriate ratio to power supplied to the light emitting elements (Lg1, Lg2, . . . ) of G-color to mix the additional light (Fga) into the main component light (Fgm). Thus, the chromaticity coordinate point (cg') of the G-color output luminous flux (Fg) is allowed to be maintained at the reference chromaticity coordinate condition.

In this case, the direction of the dashed line in the spectrum locus in proximity to the chromaticity coordinate point (cg') substantially coincides with a direction joining the chromaticity coordinate point (cg') and the chromaticity coordinate point (cb) of B-color. Accordingly, when the power supplied to the light emitting element (Lga) of B-color is so adjusted as to make only the y-coordinate of the chromaticity coordinate point (cg') as one of the chromaticity coordinates equal to the y-coordinate in the above-described reference chromaticity coordinate condition, the y-coordinate and the x-coordinate are maintained at the reference chromaticity coordinate condition at favorable accuracy. Note that in proximity to the chromaticity coordinate point (cg'), the direction of the dashed line in the spectrum locus and the direction joining the chromaticity coordinate point (cg') and the chromaticity coordinate point (cb) of B-color are substantially directed to the direction of the y axis; therefore, as described above, the y-coordinate of the chromaticity coordinate point (cg') may be preferably so adjusted as to be equal to the y-coordinate of the reference chromaticity coordinate condition.

In the third case, when the wavelength of the light emitting elements (Lg1, Lg2, . . . ) of G-color that generate the main component light (Fgm) of the G-color output luminous flux (Fg) is varied, the chromaticity coordinate point (cg") of the main component light (Fgm) moves closer to the chromaticity coordinate point (cr) of R-color or the chromaticity coordinate point (cb) of B-color on the dashed line on the spectrum locus where the chromaticity coordinate point (cg") is located. Therefore, for example, in a case where a condition for allowing the center of a range where the chromaticity coordinate point (cg") moves is set as a reference chromaticity coordinate condition, if the color of the light emitting elements (Lg1, Lg2, . . . ) of G-color is located at a position farther from the chromaticity coordinate point (cr) than the reference condition, the light emitting element (Lga) of R-color that generates the additional light (Fga) of the G-color output luminous flux (Fg) emits light by power having an appropriate ratio to power supplied to the light emitting elements (Lg1, Lg2, ... ) of G-color to mix the additional light (Fga) into the main component light (Fgm). Thus, the chromaticity coordinate point (cg″) of the G-color output luminous flux (Fg) is allowed to be maintained at the reference chromaticity coordinate condition. If the color of the G-color light emitting elements (Lg1, Lg2, ... ) is located at a position farther from the chromaticity coordinate point (cb) of B-color than the reference condition, the B-color light emitting element (Lga) generating the additional light (Fga) of the G-color output luminous flux (Fg) emits light by power having an appropriate ratio to power supplied to the G-color light emitting elements (Lg1, Lg2, ... ) to mix the additional light (Fga) into the main component light (Fgm). Thus, the chromaticity coordinate point (cg″) of the G-color output luminous flux (Fg) is allowed to be maintained at the reference chromaticity coordinate condition.

In this case, the direction of the dashed line in the spectrum locus in proximity to the chromaticity coordinate point (cg″) is substantially directed to the direction of the x axis; therefore, the x-coordinate of the chromaticity coordinate point (cg″) may be preferably so adjusted as to be equal to the x-coordinate of the reference chromaticity coordinate condition.

Note that the case where only one of the light emitting element of R-color and the light emitting element of B-color emits light as the additional light (Fga) is described above; however, both the light emitting element of R-color and the light emitting element of B-color may emit light at an appropriate mixing ratio so that the y-coordinate of the chromaticity coordinate point (cg″) is adjusted to be equal to the y-coordinate of the reference chromaticity coordinate condition.

Moreover, the case where the light emitting element of R-color and the light emitting element of B-color are provided as the light emitting elements generating the additional light (Fga) of the G-color output luminous flux (Fg) is described above; however, the light emitting element of G-color located at the chromaticity coordinate point (cg) may be provided in place of the light emitting element of R-color, or the light emitting element of G-color located at the chromaticity coordinate point (cg′) may be provided in place of the light emitting element of B-color. Further, the case where the main component light (Fgm) is light located at one of the chromaticity coordinate point (cg), the chromaticity coordinate point (cg′), and the chromaticity coordinate point (cg″) is described above; however, the embodiment of the invention is applicable to a case where the main component light (Fgm) is a mixture of two or all of light located at the chromaticity coordinate point (cg), light located at the chromaticity coordinate point (cg′), and light located at the chromaticity coordinate point (cg″).

Note that, in the embodiment of the invention, the additional light (Fga) may not be included in the G-color output luminous flux (Fg), and in this case, quantities such as a luminous flux intensity indicating value for the additional light (Fga) and a ratio of the intensity of the additional light (Fga) to the intensity of the main component light may be set to zero to omit calculation for determining these quantities. As the premise thereof, the following description is given based on a case where the additional light (Fga) is included in the G-color output luminous flux (Fg).

As described above, the R-color luminous flux characteristic measurement means (Ar), the G-color luminous flux characteristic measurement means (Ag), and the B-color luminous flux characteristic measurement means (Ab) may measure deviation from normal wavelength and intensity of the main component light (Frm, Fgm, Fbm) of the entered output luminous flux, and may measure intensity of the additional light (Fra, Fga, Fba). The configuration of the luminous flux characteristic measurement means for achieving this is described with reference to FIG. 5 that is a block diagram illustrating a part of the light source unit according to the embodiment of the invention in a simplified manner. The figure and the following description is given of the R-color luminous flux characteristic measurement means (Ar); however, the same applies to the G-color luminous flux characteristic measurement means (Ag) and the B-color luminous flux characteristic measurement means (Ab).

Part of the measurement-use output luminous flux (Fr′) having entered the R-color luminous flux characteristic measurement means (Ar) passes through an additional light filter (Erta) to enter an optical sensor (Cra) as additional light measurement-use output luminous flux (Frta) that does not include the main component light (Frm) of R-color. The additional light filter (Erta) allows only light of a wavelength band in the vicinity of the additional light (Fra) to pass therethrough. Moreover, other part of the measurement-use output luminous flux (Fr′) passes through a main component light filter (Ertm) to enter a first light intensity detector (Arm1) and a second light intensity detector (Arm2) as main component light measurement-use output luminous flux (Frtm) not including the additional light (Fra) of G-color. The main component light filter (Ertm) allows only light of a wavelength band in the vicinity of the main component light (Frm) to pass therethrough. The first light intensity detector (Arm1) and the second light intensity detector (Arm2) are different from each other in rate of sensitivity varying against wavelength varying at least in the vicinity of the wavelength of the main component light (Frm).

In the first light intensity detector (Arm1), the main component light measurement-use output luminous flux (Frtm) enters a first light characteristic filter (Ers1) having certain spectral transmittance characteristics, and a main component light measurement-use output luminous flux (Frs1) having passed through the first light characteristic filter (Ers1) is received by an optical sensor (Cr1). A photodetection signal (Srm1) from the optical sensor (Cr1) is subjected to necessary processing such as amplification and AD conversion by a light intensity measurement circuit (Hr). As a result, first light intensity data of R-color main component light of the R-color output luminous flux (Fr) based on the spectral transmittance characteristics of the first light characteristic filter (Ers1) is generated as part of the luminous flux chromaticity-intensity correlation data (Dr).

In addition to the spectral sensitivity characteristics caused by the light characteristic filter (Ers1) and the main component light filters (Ertm), spectral sensitivity characteristics of the optical sensor (Cr1) are reflected in the spectral sensitivity characteristics of the first light intensity detector (Arm1).

The same applies to the second light intensity detector (Arm2). The main component light measurement-use output luminous flux (Frtm) enters a second light characteristic filter (Ers2), and a main component light measurement-use output luminous flux (Frs2) having passed through the second light characteristic filter (Ers2) is received by an optical sensor (Cr2). The second light characteristic filter (Ers2) is different from the first light characteristic filter (Ers1) in rate of sensitivity varying against wavelength varying in the vicinity of the wavelength of the main component light (Frm). A photodetection signal (Srm2) from the optical sensor (Cr2) is subjected to necessary processing such as amplification and AD conversion by the light intensity measurement circuit (Hr). As a result, second light intensity data of the R-color main component light of the R-color output luminous flux (Fr) based on the spectral transmittance characteristics of the second light characteristic filter (Ers2) is generated as part of the luminous flux chromaticity-intensity correlation data (Dr). Moreover, a photodetection signal (Srma) from the optical sensor (Cra) is subjected to necessary processing such as amplification and AD conversion by the light intensity measurement circuit (Hr). As a result, light intensity data of R-color additional light of the R-color output luminous flux (Fr) is generated as part of the luminous flux chromaticity-intensity correlation data (Dr).

The first light characteristic filter (Ers1) of the first light intensity detector (Arm1) and the main component light filter (Ertm) may not be separated, and the first light characteristic filter (Ers1) may be configured to further have a function of the main component light filter (Ertm). The same applies to the second light characteristic filter (Ers2) of the second light intensity detector (Arm2). In addition, the light characteristic filter of one of the first light intensity detector (Arm1) and the second light intensity detector (Arm2) may be transparent.

Then, the control circuit (Mc) may receive the luminous flux chromaticity-intensity correlation data (Dr) and read the first light intensity data of the R-color main component light, the second light intensity data of the R-color main component light, and the light intensity data of the R-color additional light. As will be described later, a combination of the first light intensity data of the R-color main component light and the second light intensity data of the R-color main component light is correlated with chromaticity coordinates and intensity of the main component light (Frm).

The configuration of the R-color luminous flux characteristic measurement means (Ar) is described above, and the generation of the luminous flux chromaticity-intensity correlation data (Dr) is described above. As described above, the same applies to the configurations of the G-color luminous flux characteristic measurement means (Ag) and the B-color luminous flux characteristic measurement means (Ab), and generation of the luminous flux chromaticity-intensity correlation data (Dg, Db).

Regarding the first spectral sensitivity characteristics of the first light intensity detector and the second spectral sensitivity characteristics of the second light intensity detector for each of the R-color luminous flux characteristic measurement means (Ar), the G-color luminous flux characteristic measurement means (Ag), and the B-color luminous flux characteristic measurement means (Ab), it is sufficient to achieve a state in which a rate of sensitivity varying against wavelength varying, namely, gradient of sensitivity varying at the time of wavelength varying are different in each of the wavelength bands of the respective main component light (Frm, Fgm, Fbm). Specifically, when expressions 8, 11, and 12 described later are regarded as simultaneous linear equation with two unknowns relating to $\Psi r$ and $\Psi r \cdot \Delta \lambda r$, $\Psi g$ and $\Psi g \cdot \Delta \lambda g$, and $\Psi b$ and $\Psi b \cdot \Delta \lambda b$, respectively, it is sufficient to achieve a state in which a determinant of each expression is not zero. Incidentally, examples of a case of difference of the rate of sensitivity varying against wavelength varying in one wavelength band may include a case in which one of the first spectral sensitivity characteristics and the second spectral sensitivity characteristics is positive and the other is negative, one of them is substantially zero and the other is not zero (a finite value), and a case where both of them have the same symbol but the absolute values thereof are different from each other. Any case may be possible.

Restriction of the rate of sensitivity varying against wavelength varying is limited to within a bandwidth that is defined by an upper limit and a lower limit of the wavelength varying caused by fluctuation of the light emitting elements (Lr1, Lr2, . . . , Lg1, Lg2, . . . , Lb1, Lb2, . . . ) for the main component light mounted on the light source unit and emission wavelength variation in the expected temperature range. The spectral sensitivity characteristics outside the bandwidth do not matter. When, out of the light emitting elements (Lr1, Lr2, . . . , Lg1, Lg2, . . . , Lb1, Lb2, . . . ) for the main component light, the light emitting elements used for one wavelength band are unified to the same products manufactured by the same manufacturer, the bandwidth is normally about several nanometers to about ten nanometers. Regarding the first spectral sensitivity characteristics and the second spectral sensitivity characteristics, however, variation of the rate of sensitivity varying against wavelength varying in the bandwidth may be desirably small.

Figure 5:
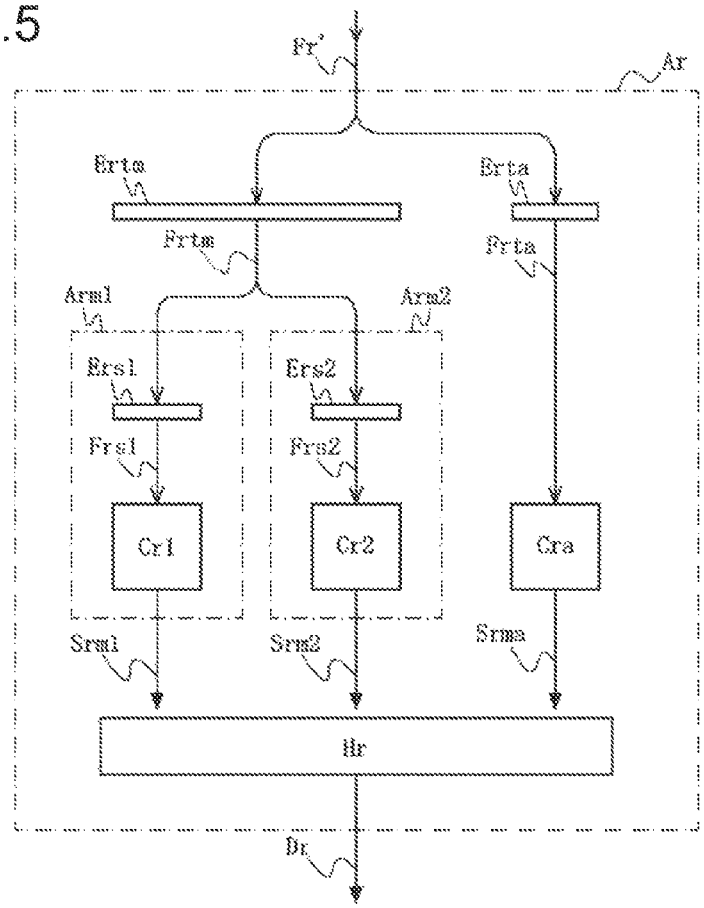
FIG. 5 is a block diagram illustrating a part of the light source unit according to the embodiment of the invention in a simplified manner.

In a case where the configuration of the luminous flux characteristic measurement means is as illustrated in FIG. 5, the control circuit (Mc) may have local color band spectral sensitivity information. The local color band spectral sensitivity information may be configured of at least the sensitivity value at normal wavelength and the rate of sensitivity varying against wavelength varying for each of the first spectral sensitivity characteristics of the first light intensity detector and the second spectral sensitivity characteristics of the second light intensity detector in each of the R-color light flux characteristic measurement means (Ar), the G-color light flux characteristic measurement means (Ag), and the B-color light flux characteristic measurement means (Ab).

Accordingly, as will be described later, the control circuit (Mc) uses the local color band spectral sensitivity information to approximately calculate the luminous flux intensity indicating values correlated with the intensity and the wavelength deviation indicating values correlated with the deviation from normal wavelength for the R-color main component light (Frm), the G-color main component light (Fgm), and the B-color main component light (Fbm), based on, out of the luminous flux chromaticity-intensity correlation data (Dr, Dg, Db) of the R-color luminous flux characteristic measurement means (Ar), the G-color luminous flux characteristic measurement means (Ag), and the B-color luminous flux characteristic measurement means (Ab), a combination of the first light intensity data of the main component light and the second light intensity data of the main component light read from the first light intensity detector and the second light intensity detector, namely, a combination of the first light intensity data of the R-color main component light and the second light intensity data of the R-color main component light, a combination of first light intensity data of G-color main component light and second light intensity data of G-color main component light, and a combination of first light intensity data of B-color main component light and second light intensity data of B-color main component light.

The control circuit (Mc) may further have local color band color matching function information that is configured of at least a function value at normal wavelength and a rate of function output varying against wavelength varying of the main component light (Frm, Fgm, Fbm) of the R-color output luminous flux (Fr), the G-color output luminous flux (Fg), and the B-color output luminous flux (Fb), and a function value at normal wavelength of the additional light (Fra, Fga, Fba) for each of the color matching functions necessary for calculation of chromaticity.

Accordingly, as will be described later, the control circuit (Mc) is allowed to generate the single-color color-phase indicating value for the output luminous flux generated by mixing the additional light (Fra, Fga, Fba) and the output luminous flux generated without mixing the additional light with use of the luminous flux intensity indicating values correlated with intensity and the wavelength deviation indicating values correlated with deviation from normal wavelength for the R-color main component light (Frm), the G-color main component light (Fgm), and the B-color main component light (Fbm) that are the luminous flux chromaticity-intensity correlation data (Dr, Dg, Db), and the local color band color matching function information. Moreover, the control circuit (Mc) is allowed to generate the integrated color-phase indicating value for integrated light of the R-color output luminous flux (Fr), the G-color output luminous flux (Fg), and the B-color output luminous flux (Fb) with use of the luminous flux chromaticity-intensity correlation data (Dr, Dg, Db) and the local color band color matching function information.

The feedback control to stabilize the color of light and the brightness of light described above is trial and error procedure because guideline to quantitatively determine variation of the output power of the drive circuits (Pr1, Pr2, ..., Pra, Pg1, Pg2, ... ) in order to cause the values x, y, and Y for each of the R-color output luminous flux (Fr), the G-color output luminous flux (Fg), the B-color output luminous flux (Fb), and the integrated light of the R-color output luminous flux (Fr), the G-color output luminous flux (Fg), and the B-color output luminous flux (Fb) to integrally direct toward the respective target values is not shown. Here, the guideline to achieve feedback control improved in this point is described.

To achieve this, the control circuit (Mc) uses the local color band spectral sensitivity information to generate the luminous flux intensity indicating values correlated with intensity and the wavelength deviation indicating values correlated with deviation from normal wavelength for the R-color main component light (Frm), the G-color main component light (Fgm), and the B-color main component light (Fbm), based on the combination of the first light intensity data of the R-color main component light and the second light intensity data of the R-color main component light, the combination of the first light intensity data of the G-color main component light and the second light intensity data of the G-color main component light, and the combination of the first light intensity data of the B-color main component light and the second light intensity data of the B-color main component light. Here, the light intensity correlates with light power of all of the light emitting elements included in one of the wavelength bands, out of the light emitting elements (Lr1, Lr2, . . . , Lra, Lg1, Lg2, . . . , Lb1, Lb2, . . . , Lba). The main component light and the additional light are separately quantified even in a case where the main component light and the additional light belong to a same wavelength band. Note that the light intensity has no relation to human visibility. Since the brightness of light is brightness sensed by a human, the brightness of light varies due to influence of visibility of a human when a wavelength varies even in the case of the same light power (density).

Moreover, the control circuit (Mc) uses the luminous flux intensity indicating values correlated with intensity and the wavelength deviation indicating values correlated with deviation from normal wavelength for the R-color main component light (Frm), the G-color main component light (Fgm), and the B-color main component light (Fbm), and the luminous flux intensity indicating values correlated with intensity for the additional light (Fra) forming the R-color output luminous flux (Fr), the additional light (Fga) forming the G-color output luminous flux (Fg), and the additional light (Fba) forming the B-color output luminous flux (Fb) to determine a ratio hr of the intensity of the additional light (Fra) to the intensity of the R-color main component light (Frm), a ratio hg of the intensity of the additional light (Fga) to the intensity of the G-color main component light (Fgm), and a ratio hb of the intensity of the additional light (Fba) to the intensity of the B-color main component light (Fbm) for allowing the y-coordinates (or the x-coordinates; coordinates more suitable for the condition as described above) of the chromaticity coordinates of the R-color output luminous flux (Fr), the G-color output luminous flux (Fg), and the B-color output luminous flux (Fb) to be equal to target values thereof.

Further, the control circuit (Mc) determines a coefficient of a linear operation with use of the luminous flux intensity indicating value and the wavelength deviation indicating value for each of the R-color main component light (Frm), the G-color main component light (Fgm), and the B-color main component light (Fbm) and the ratio hr of the intensity of the additional light (Fra) to the intensity of the R-color main component light (Frm), the ratio hg of the intensity of the additional light (Fga) to the intensity of the G-color main component light (Fgm), and the ratio hb of the intensity of the additional light (Fba) to the intensity of the G-color main component light (Fgm). The linear operation represents, with use of the variation of the luminous flux intensity indicating values, the variation occurred in the tristimulus values or the chromaticity coordinates as the color-phase indicating values when the luminous flux intensity indicating values of the R-color main component light (Frm), the G-color main component light (Fgm), and the B-color main component light (Fbm) are slightly varied.

Then, with use of the determined coefficient, the control circuit (Mc) determines variation that is to slightly vary the luminous flux intensity indicating values of the R-color main component light (Frm), the G-color main component light (Fgm), and the B-color main component light (Fbm). Based on the variation, the control circuit (Mc) sets output power of the drive circuits (Pr1, Pr2, . . . , Pra, Pg1, Pg2, . . . , Pb1, Pb2, . . . , Pba) through the respective drive circuit control signals (Jr1, Jr2, . . . , Jra, Jg1, Jg2, . . . , Jb1, Jb2, . . . , Jba).

The above-described operation is repeated to build the feedback control loop so that the y-coordinate (or the x-coordinate; a coordinate more suitable for the condition as described above) of the chromaticity coordinates of each of the R-color output luminous flux (Fr), the G-color output luminous flux (Fg), and the B-color output luminous flux (Fb) is maintained to be equal to the target value thereof and tristimulus values X, Y, and Z or the chromaticity coordinates x and y and the brightness of light Y of the integrated light of the R-color output luminous flux (Fr), the G-color output luminous flux (Fg), and the B-color output luminous flux (Fb) are maintained at the target values thereof.

According to the electric power and light intensity proportion rule, it is considerable that the luminous flux intensity indicating values of the R-color main component light (Frm), the G-color main component light (Fgm), and the B-color main component light (Fbm) are respectively proportional to the total output power Pr of the drive circuits driving the light emitting elements that generate the R-color main component light (Frm), the total output power Pg of the drive circuits driving the light emitting elements that generate the G-color main component light (Fgm), and the total output power Pb of the drive circuits driving the light emitting elements that generate the B-color main component light, independently, out of the drive circuits (Pr1, Pr2, . . . , Pra, Pg1, Pg2, . . . , Pba, Pb1, Pb2, . . . , Pba). For example, when the luminous flux intensity indicating values of the R-color main component light (Frm), the G-color main component light (Fgm), and the B-color main component light (Fbm) are all increased by 1%, in a case where the total output power are 200 W, 300 W, and 100 W, respectively, the total output power are increased to 202 W, 303 W, and 101 W, respectively.

The guideline to achieve the improved feedback control is quantitatively described below. Note that in the above-described expressions such as the expression 1, "S" is used as the intensity of spectrum of a general luminous flux; however, in the following, for classification, "Ψ" represents intensity for the main component light, and "ψ" represents intensity for the additional light.

First, a method of calculating the luminous flux intensity indicating values and the deviation from normal wavelength that is the wavelength deviation indicating values based on the first light intensity data of the R-color main component light and the second light intensity data of the R-color main component light is described. The first light intensity data of the R-color main component light and the second light intensity data of the R-color main component light are obtained by measuring R-color main component light to be measured with use of the first light intensity detector (Arm1) and the second light intensity detector (Arm2). The R-color main component light to be measured is represented by spectrum $\Psi r(\lambda)$ having a wavelength $\lambda$ as a parameter.

When the first light intensity detector (Arm1) and the second light intensity detector (Arm2) of the R-color luminous flux characteristic measurement means (Ar) respectively include spectral sensitivity characteristics $rm(\lambda)$ and $rn(\lambda)$ in the R-color wavelength band, light intensity measurement data values Rm and Rn included in the first light intensity data of the R-color main component light and the second light intensity data of the R-color main component light are represented by the following expressions (expression 4).

$$Rm = \int \Psi r(\lambda) \cdot rm(\lambda) \cdot d\lambda$$

$$Rn = \int \Psi r(\lambda) \cdot rn(\lambda) \cdot d\lambda \quad \text{(Expression 4)}$$

These integration regions cover at least the respective wavelength bands in which spectrum $\Psi r(\lambda)$ of the luminous flux to be measured exists.

Here, when the luminous flux to be measured is approximated to be single-color light, the spectrum $\Psi r(\lambda)$ thereof is represented by the following expression (expression 5) with use of the delta function $\delta(\lambda)$.

$$\Psi r(\lambda) = \Psi r \cdot \delta(\lambda - \lambda ro - \Delta Xr) \quad \text{(Expression 5)}$$

Where, the normal wavelength of the R-color main component light is denoted by $\lambda ro$, the deviation from normal wavelength as the wavelength deviation indicating value is denoted by $\Delta\lambda r$, and the luminous flux intensity indicating value of the R-color main component light (Frm) is denoted by $\Psi r$.

Typically, variation $\Delta f$ in the function $f=f(\lambda)$ when the variable $\lambda$ of the function f is slightly varied by $\Delta\lambda$ is approximated by the following expression (expression 6) with use of the derivative $df/d\lambda$ of the function f.

$$\Delta f = (df/d\lambda) \cdot \Delta\lambda \quad \text{(Expression 6)}$$

Accordingly, when the variable $\lambda$ is represented by $\lambda = \lambda ro + \Delta\lambda r$ in the case where the variable $\lambda$ is in the vicinity of $\lambda ro$, the spectral sensitivity characteristics are represented by the following expressions (expression 7).

$$rm(\lambda) = rm(\lambda ro + \Delta\lambda r) = rm(\lambda ro) + Ermo \cdot \Delta\lambda r$$

$$rn(\lambda) = rn(\lambda ro + \Delta\lambda r) = rn(\lambda ro) + Erno \cdot \Delta\lambda r \quad \text{(Expression 7)}$$

Where, Ermo and Erno are values when the variable $\lambda$ in the derivative of $rm(\lambda)$ and $rn(\lambda)$ is $\lambda ro$. The expressions 5 and 7 are applied to the expression 4, the following expressions (expression 8) are obtained.

$$Rm = \Psi r \cdot \int \delta(\lambda - \lambda ro - \Delta\lambda r) \cdot rm(\lambda) \cdot d\lambda \quad \text{(Expression 8)}$$
$$= \Psi r \cdot rm(\lambda ro + \Delta\lambda r)$$
$$= \Psi r \cdot \{rm(\lambda ro) + Ermo \cdot \Delta\lambda r\}$$

$$Rn = \Psi r \cdot \{rn(\lambda ro) + Erno \cdot \Delta\lambda r\}$$

where, $$Ermo = drm/d\lambda(\lambda = \lambda ro)$$

$$Erno = drn/d\lambda(\lambda = \lambda ro)$$

These expressions are rewritten in the following expression (Expression 8'). As described above, these expressions are simultaneous linear equation with two unknowns relating to $\Psi r$ and $\Psi r \cdot \Delta\lambda r$. Therefore, the expressions are solved by elementary calculation to obtain the values $\Psi r$ and $\Psi r \cdot \Delta\lambda r$, or the values $\Psi r$ and $\Delta\lambda r$.

$$Rm = rm(\lambda ro) \cdot \Psi r + Ermo \cdot \Psi r \cdot \Delta\lambda r$$

$$Rn = rn(\lambda ro) \cdot \Psi r + Erno \cdot \Psi r \cdot \Delta\lambda r \quad \text{(Expression 8')}$$

The R-color main component light (Frm) is described above. The same applied to the G-color main component light (Fgm) and the B-color main component light (Fbm). When the spectral sensitivity characteristics $gm(\lambda)$ and $gn(\lambda)$ of the G-color wavelength band in the G-color luminous flux characteristic measurement means (Ag) and the spectral sensitivity characteristics $bm(\lambda)$ and $bn(\lambda)$ of the B-color wavelength band in the B-color luminous flux characteristic measurement means (Ab) are used, the light intensity measurement data values Gm, Gn, Bm, and Bn included in the first light intensity data of the G-color main component light and the second light intensity data of the G-color main component light, and the first light intensity data of the B-color main component light and the second light intensity data of the B-color main component light are represented by the following expressions (expression 9).

$$Gm = \int \Psi g(\lambda) \cdot gm(\lambda) \cdot d\lambda$$

$$Gn = \int \Psi g(\lambda) \cdot gn(\lambda) \cdot d\lambda$$

$$Bm = \int \Psi b(\lambda) \cdot bm(\lambda) \cdot d\lambda$$

$$Bn = \int \Psi b(\lambda) \cdot bn(\lambda) \cdot d\lambda \quad \text{(Expression 9)}$$

When the spectrums $\Psi g(\lambda)$ and $\Psi b(\lambda)$ of the G-color main component light (Fgm) and the B-color main component light (Fbm) in the above-described expression 9 are also represented by the delta function $\delta(\lambda)$ with use of respective normal wavelengths $\lambda go$ and $\lambda bo$ of the G-color main component light and the B-color main component light, deviation from normal wavelength Δλg and Δλb as the wavelength deviation indicating values, and the luminous flux intensity indicating values Ψg and Ψb, the spectrums Ψg(λ) and Ψb(λ) of the G-color main component light (Fgm) and the B-color main component light (Fbm) are represented by the following expressions (expression 10).

$$\Psi g(\lambda) = \Psi g \cdot \delta(\lambda - \lambda go - \Delta\lambda g)$$

$$\Psi b(\lambda) = \Psi b \cdot \delta(\lambda - \lambda bo - \Delta\lambda b) \quad \text{(Expression 10)}$$

Accordingly, the following expressions (expressions 11 and 12) are obtained similarly to the above-described expression 8, and the values Ψg and Δλg and values Ψb and Δλb are determined by these expressions.

$$Gm = \Psi g \cdot \{gm(\lambda go) + Egmo \cdot \Delta\lambda g\}$$

$$Gn = \Psi g \cdot \{gn(\lambda go) + Egno \cdot \Delta\lambda g\}$$

where $$Egmo = dgm/d\lambda(\lambda = \lambda go)$$

$$Egno = dgn/d\lambda(\lambda = \lambda go) \quad \text{(Expression 11)}$$

$$Bm = \Psi b \cdot \{bm(\lambda bo) + Ebmo \cdot \Delta\lambda b\}$$

$$Bn = \Psi b \cdot \{bn(\lambda bo) + Ebno \cdot \Delta\lambda b\}$$

where $$Ebmo = dbm/d\lambda(\lambda = \lambda bo)$$

$$Ebno = dbn/d\lambda(\lambda = \lambda bo) \quad \text{(Expression 12)}$$

A procedure to determination of the luminous flux intensity indicating values Ψr, Ψg, and Ψb and the deviation from normal wavelength Δλr, Δλg, and Δλb as the wavelength deviation indicating values for the R-color main component light (Frm), the G-color main component light (Fgm), and the B-color main component light (Fbm) is summarized as follows. The luminous flux intensity indicating values Ψr, Ψg, and Ψb and the deviation from normal wavelength Δλr, Δλg, and Δλb are determined, based on, out of the luminous flux chromaticity-intensity correlation data (Dr, Dg, Db), the first light intensity data of the R-color main component light and the second light intensity data of the R-color main component light, namely, Rm and Rn measured with use of the R-color luminous flux characteristic measurement means (Ar), the first light intensity data of the G-color main component light and the second light intensity data of the G-color main component light, namely, Gm and Gn measured with use of the G-color luminous flux characteristic measurement means (Ag), and the first light intensity data of the B-color main component and the second light intensity data of the B-color main component, namely, Bm and Bn measured with use of the B-color luminous flux characteristic means (Ab).

First, the local color band spectral sensitivity information relating the R-color luminous flux characteristic measurement means (Ar), namely, the values rm(λro) and m(λro) of the spectral sensitivity characteristics rm(λ) and rn(λ) at the normal wavelength λro of the R-color main component light (Frm) and the values Ermo and Erno of the rate of sensitivity varying against wavelength varying of the spectral sensitivity characteristics are prepared in advance. Moreover, the local color band spectral sensitivity information relating to the G-color luminous flux characteristic measurement means (Ag), namely, the values gm(λgo) and gn(λgo) of the spectral sensitivity characteristics gm(λ) and gn(λ) at the normal wavelength λgo of the G-color main component light (Fgm), and the values Egmo and Egno of the rate of sensitivity varying against wavelength varying of the spectral sensitivity characteristics are prepared in advance. Further, the local color band spectral sensitivity information relating to the B-color luminous flux characteristic measurement means (Ab), namely, the values bm(λbo) and bn(λbo) of the spectral sensitivity characteristics bm(λ) and bn(λ) at the normal wavelength λbo of the B-color main component light (Fbm) and the values Ebmo and Ebno of the rate of sensitivity varying against wavelength varying of the spectral sensitivity characteristics are prepared in advance. Then, when the light intensity measurement data values Rm, Rn, Gm, Gn, Bm, and Bn are obtained, it is possible to easily determine the luminous flux intensity indicating values Ψr, Ψg, and Ψb and the deviations from normal wavelength Δλr, Δλg, and Δλb as the wavelength deviation indicating values, from the solution of the expressions 8, 11, and 12.

Moreover, the luminous flux intensity indicating values ψr, ψg, and ψb relating to the additional light (Fra) forming the R-color output luminous flux (Fr), the additional light (Fga) forming the G-color output luminous flux (Fg), and the additional light (Fba) forming the B-color output luminous flux (Fb) may be respectively obtained from the light intensity data of the R-color additional light, the light intensity data of the G-color additional light, and the light intensity data of the B-color additional light included in the luminous flux chromaticity-intensity correlation data (Dr, Dg, Db). The light intensity data of the R-color additional light, the light intensity data of the G-color additional light, and the light intensity data of the B-color additional light are respectively measured, concurrently with measurement on the main component light, by the R-color luminous flux characteristic measurement means (Ar), the G-color luminous flux characteristic measurement means (Ag), and the B-color luminous flux characteristic measurement means (Ab).

Out of the drive circuits (Pr1, Pr2, . . . Pg1, Pg2, . . . , Pb1, Pb2, . . . ) described for the electric power and light intensity proportion rule, the total output power Pr of the drive circuits driving the light emitting elements that generate R-color main component light (Frm), the total output power Pg of the drive circuits driving the light emitting elements that generate the G-color main component light (Fgm), and the total output power Pb of the drive circuits driving the light emitting elements that generate the B-color main component light (Fbm) are represented by the following expressions (expression 13). The expressions are represented by independent proportionality coefficients Kr, Kg, and Kb and the target values Ψrp, Ψgp, and Ψbp of the luminous flux intensity indicating values Ψr, Ψg, and Ψb of the R-color main component light (Frm), the G-color main component light (Fgm), and the B-color main component light (Fbm).

$$Pr = Kr \cdot \Psi rp$$

$$Pg = Kg \cdot \Psi gp$$

$$Pb = Kb \cdot \Psi bp \quad \text{(Expression 13)}$$

Likewise, out of the drive circuits (Pra, Pga, Pba, . . . ), the total output power pr of the drive circuits driving the light emitting elements that generate the additional light (Fra) forming the R-color output luminous flux (Fr), the total output power pg of the drive circuits driving the light emitting elements that generate the additional light (Fga)

forming the G-color output luminous flux (Fg), and the total output power pb of the drive circuits driving the light emitting elements that generate the additional light (Fba) forming the B-color output luminous flux (Fb) are represented by the following expressions (Expression 14). The expressions are represented by independent proportionality coefficients kr, kg, and kb and the target values $\psi rp$, $\psi gp$, and $\psi bp$ of the luminous flux intensity indicating values $\psi r$, $\psi g$, and $\psi b$ of the additional light (Fra) forming the R-color output luminous flux (Fr), the additional light (Fga) forming the G-color output luminous flux (Fg), and the additional light (Fba) forming the B-color output luminous flux (Fb).

$$pr = kr \cdot \psi rp$$

$$pg = kg \cdot \psi gp$$

$$pb = kb \cdot \psi bp \quad \text{(Expression 14)}$$

The target values $\psi rp$, $\psi gp$, and $\psi bp$ are respectively linked to the target values $\Psi rp$, $\Psi gp$, and $\Psi bp$ by the following expressions (expression 15) through the ratio hr of the intensity of the additional light (Fra) to the intensity of the R-color main component light (Frm), the ratio hg of the intensity of the additional light (Fga) to the intensity of the G-color main component light (Fgm), and the ratio hb of the intensity of the additional light (Fba) to the intensity of the B-color main component light (Fbm).

$$\psi rp = hr \cdot \Psi rp$$

$$\psi gp = hg \cdot \Psi gp$$

$$\psi bp = hb \cdot \Psi bp \quad \text{(Expression 15)}$$

Based on the first light intensity data of the R-color main component light and the second light intensity data of the R-color main component light, namely, Rm and Rn measured with use of the R-color luminous flux characteristic measurement means (Ar), the first light intensity data of the G-color main component light and the second light intensity data of the G-color main component light, namely, Gm and Gn measured with use of the G-color luminous flux characteristic measurement means (Ag), and the first light intensity data of the B-color main component and the second light intensity data of the B-color main component, namely, Bm and Bn measured with use of the B-color luminous flux characteristic means (Ab), it is possible to determine the proportionality coefficients Kr, Kg, and Kb of the above-described expression 13 from the ratio of the luminous flux intensity indicating values $\Psi r$, $\Psi g$, and $\Psi b$ that are obtained by solving the expressions 8, 11, and 12 and the above-described total output power Pr, Pg, and Pb.

First, it is assumed that safe initial values that are unspecified but appropriately determined are set to the proportionality coefficients Kr, Kg, and Kb. The total output power Pr, Pg, and Pb that may cause safe initial target values $\Psi rp$, $\Psi gp$, and $\Psi bp$ that are appropriately determined with respect to the luminous flux intensity indicating values $\Psi r$, $\Psi g$, and $\Psi b$ are tentatively determined by the expression 13 based on the unspecified proportionality coefficients Kr, Kg, and Kb. Based on the light intensity measurement data values Rm, Rn, Gm, Gn, Bm, and Bn when the light emitting elements are actually driven with the values of the total output power Pr, Pg, and Pb, the proportionality coefficients Kr, Kg, and Kb may be corrected according to the following expressions (expression 16), with use of the ratio of the luminous flux intensity indicating values $\Psi r$, $\Psi g$, and $\Psi b$ that are obtained by solving the expressions 8, 11, and 12 and the original target values $\Psi rp$, $\Psi gp$, and $\Psi bp$.

$$Kr = Kr \cdot \Psi rp / \Psi r$$

$$Kg = Kg \cdot \Psi gp / \Psi g$$

$$Kb = Kb \cdot \Psi bp / \Psi b \quad \text{(Expression 16)}$$

This correction may be performed every time the slight variation $\Delta\Psi r$, $\Delta\Psi g$, and $\Delta\Psi b$ of the luminous flux intensity indicating values $\Psi r$, $\Psi g$, and $\Psi b$ are determined, the target values $\Psi rp$, $\Psi gp$, and $\Psi bp$ are updated according to the following expressions (expression 17), power is reset according to the above-described expression 13, and the light intensity measurement data values Rm, Rn, Gm, Gn, Bm, and Bn are measured, in repeat of the feedback control loop as described above.

$$\Psi rp = \Psi r + \Delta\Psi r$$

$$\Psi gp = \Psi g + \Delta\Psi g$$

$$\Psi bp = \Psi b + \Delta\Psi b \quad \text{(Expression 17)}$$

In this way, as described above, even if the proportionality coefficients Kr, Kg, and Kb are not true proportionality constants but are non-linear coefficients showing, for example, saturation tendency, correction is repeatedly performed as a merely ratio defined by the expression 13. Accordingly, proper correspondence between the total output power Pr, Pg, and Pb of the drive circuits of R, G, and B and the luminous flux intensity indicating values $\Psi r$, $\Psi g$, and $\Psi b$ (and the target values $\Psi rp$, $\Psi gp$, and $\Psi bp$) is maintained.

Also, it is assumed that safe initial values that are unspecified but appropriately determined are first set to the ratio hr, hg, and hb and the proportionality coefficients kr, kg, and kb. The total output power pr, pg, and pb relating to the additional light that may cause safe initial target values $\Psi rp$, $\psi gp$, $\psi bp$ that are appropriately determined with respect to the luminous flux intensity indicating values $\psi r$, $\psi g$, and $\psi b$ are tentatively determined by the expressions 14 and 15 based on the unspecified proportionality coefficients kr, kg, and kb. The proportionality coefficients kr, kg, and kb may be corrected according to the following expressions (expression 18), with use of the ratio of the luminous flux intensity indicating values $\psi r$, $\psi g$, and $\psi b$ that are obtained from the light intensity data of the R-color additional light, the light intensity data of the G-color additional light, and the light intensity data of the B-color additional light when the light emitting elements are actually driven with the values of the total output power pr, pg, and pb, and the original target values $\psi rp$, $\psi gp$, and $\psi bp$.

$$kr = kr \cdot \psi rp / \psi r$$

$$kg = kg \cdot \psi gp / \psi g$$

$$kb = kb \cdot \psi bp / \psi b \quad \text{(Expression 18)}$$

This correction may be performed every time the target values $\Psi rp$, $\Psi gp$, and $\Psi bp$ and the ratio hr, hg, and hb are updated in repeat of the feedback control loop.

Incidentally, the equal sign in each expression of the expressions 16 and 18 indicates that calculation result on right side is assigned to the variable on left side, which is represented according to notation of calculation instruction of typical programming language such as C.

Subsequently, there is described a method of determining the ratio hr, hg, and hb in order to achieve the target value of the y-coordinate of the chromaticity coordinates for the R-color output luminous flux (Fr), the G-color output luminous flux (Fg), and the B-color output luminous flux (Fb), with use of the luminous flux intensity indicating values Ψr, Ψg, and Ψb relating to the main component light, the deviation from normal wavelength Δλr, Δλg, and Δλb as the wavelength deviation indicating values, and the luminous flux intensity indicating values ψr, ψg, and ψb relating to the additional light, that are specifically determined. Thereafter, there is described a method of determining the variation ΔΨr, ΔΨg, and ΔΨb when the luminous flux intensity indicating values Ψr, Ψg, and Ψb are slightly varied, in order to perform the feedback control such that the tristimulus values X, Y, and Z are maintained to the target values thereof or the chromaticity coordinates x and y and the brightness of light Y are maintained to the target values thereof for the integrated light of the R-color output luminous flux (Fr), the G-color output luminous flux (Fg), and the B-color output luminous flux (Fb).

Regarding the above-described color matching functions xe(λ), ye(λ), and ze(λ), when the wavelength λ is represented by λ=λro+Δλr in the case where the variable λ is in the vicinity of λro, the following expressions (expression 20) are obtained by applying the above-described expression 6 in a similar manner.

$xe(\lambda)=xe(\lambda ro+\Delta\lambda r)=xe(\lambda ro)+Fxro\cdot\Delta\lambda r$ $ye(\lambda)=ye(\lambda ro+\Delta\lambda r)=ye(\lambda ro)+Fyro\cdot\Delta\lambda r$ $ze(\lambda)=ze(\lambda ro+\Delta\lambda r)=ze(\lambda ro)+Fzro\cdot\Delta\lambda r$ where $Fxro=dxe/d\lambda(\lambda=\lambda ro)$ $Fyro=dye/d\lambda(\lambda=\lambda ro)$ $Fzro=dze/d\lambda(\lambda=\lambda ro)$ (Expression 20)

Likewise, when the variable λ is represented by λ=λgo+Δλg in the case where the variable λ is in the vicinity of λro, the following expressions (expression 21) are obtained.

$xe(\lambda)=xe(\lambda go+\Delta\lambda g)=xe(\lambda go)+Fxgo\cdot\Delta\lambda g$ $ye(\lambda)=ye(\lambda go+\Delta\lambda g)=ye(\lambda go)+Fygo\cdot\Delta\lambda g$ $ze(\lambda)=ze(\lambda go+\Delta\lambda g)=ze(\lambda go)+Fzgo\cdot\Delta\lambda g$ where $Fxgo=dxe/d\lambda(\lambda=\lambda go)$ $Fygo=dye/d\lambda(\lambda=\lambda go)$ $Fzgo=dze/d\lambda(\lambda=\lambda go)$ (Expression 21)

Further, when the variable λ is represented by λ=λbo+Δλb in the case where the variable λ is in the vicinity of λbo, the following expressions (expression 22) are obtained.

$xe(\lambda)=xe(\lambda bo+\Delta\lambda b)=xe(\lambda bo)+Fxbo\cdot\Delta\lambda g$ $ye(\lambda)=ye(\lambda bo+\Delta\lambda b)=ye(\lambda bo)+Fybo\cdot\Delta\lambda b$ $ze(\lambda)=ze(\lambda bo+\Delta\lambda b)=ze(\lambda bo)+Fzbo\cdot\Delta\lambda b$ where $Fxbo=dxe/d\lambda(\lambda=\lambda bo)$ $Fybo=dye/d\lambda(\lambda=\lambda bo)$ $Fzbo=dze/d\lambda(\lambda=\lambda bo)$ (Expression 22)

It is assumed that the R-color output luminous flux (Fr) is a mixture of the single-color main component light (Frm) and the single-color additional light (Fra). When the color of the additional light (Fra) is G-color and the normal wavelength of the additional light (Fra) is represented by λgo', the spectrum Sr(λ) thereof is represented by the following expression (expression 23) with use of a delta function. Accordingly, the following expressions (expression 24) are obtained as the tristimulus values Xr, Yr, and Zr of the R-color output luminous flux (Fr).

$$Sr(\lambda) = \Psi r \cdot \delta(\lambda - \lambda ro - \Delta\lambda r) + \psi r \cdot \delta(\lambda - \lambda ro') \quad \text{(Expression 23)}$$

$$\begin{aligned}Xr &= \Psi r \cdot xe(\lambda ro + \Delta\lambda r) + \psi r \cdot xe(\lambda go') \quad \text{(Expression 24)}\\ &= \Psi r \cdot \{xe(\lambda ro) + Fxro \cdot \Delta\lambda r\} + \psi r \cdot xe(\lambda go')\\ Yr &= \Psi r \cdot \{ye(\lambda ro) + Fyro \cdot \Delta\lambda r\} + \psi r \cdot ye(\lambda go')\\ Zr &= \Psi r \cdot \{ze(\lambda ro) + Fzro \cdot \Delta\lambda r\} + \psi r \cdot ze(\lambda go')\end{aligned}$$

The normal wavelength λgo' of the G-color additional light (Fra) and the normal wavelength λgo of the G-color main component light (Fgm) may be the same as or different from each other.

Likewise, it is assumed that the G-color output luminous flux (Fg) is a mixture of the single-color main component light (Fgm) and the single-color additional light (Fga). When the color of the additional light (Fga) is R-color corresponding to the chromaticity coordinate point (cg) in FIG. 4, and the normal wavelength thereof is represented by λro', the following expressions (expression 25) are obtained as the tristimulus values Xg, Yg, and Zg of the R-color output luminous flux (Fr).

$$\begin{aligned}Xg &= \Psi g \cdot xe(\lambda go + \Delta\lambda g) + \psi g \cdot xe(\lambda ro') \quad \text{(Expression 25)}\\ &= \Psi g \cdot \{xe(\lambda go) + Fxgo \cdot \Delta\lambda g\} + \psi g \cdot xe(\lambda ro')\\ Yg &= \Psi g \cdot \{ye(\lambda go) + Fygo \cdot \Delta\lambda g\} + \psi g \cdot ye(\lambda ro')\\ Zg &= \Psi g \cdot \{ze(\lambda go) + Fzgo \cdot \Delta\lambda g\} + \psi g \cdot ze(\lambda ro')\end{aligned}$$

The normal wavelength λro' of the R-color additional light (Fga) and the normal wavelength λro of the R-color main component light (Frm) may be the same as or different from each other.

When the color of the additional light (Fga) is B-color corresponding to the chromaticity coordinate point (cg') in FIG. 4, the normal wavelength λro' may be replaced by the normal wavelength λbo'. The normal wavelength λbo' of the B-color additional light (Fba) and the normal wavelength λbo of the B-color main component light (Fbm) of the B-color output luminous flux (Fb) may be the same as or different from each other. Moreover, when the additional light (Fga) is both R-color and B-color corresponding to the chromaticity coordinate point (cg") in FIG. 4, the luminous flux intensity indicating value ψg may be of the light emitting element that emits light at that time. Note that in the following description, it is always possible to replace the normal wavelength λro' of the additional light (Fga) of the G-color output luminous flux (Fg) by λbo' according to the chromaticity coordinate points (cg, cg', cg") of the main component light (Fgm).

Likewise, it is assumed that the B-color output luminous flux (Fb) is a mixture of the single-color main component light (Fbm) and the single-color additional light (Fba). When the color of the additional light (Fba) is G-color, and the normal wavelength is represented by λgo″, the following expressions (expression 26) are obtained as the tristimulus values Xb, Yb, and Zb of the R-color output luminous flux (Fr).

$$Xb = \Psi b \cdot xe(\lambda bo + \Delta \lambda b) + \psi b \cdot xe(\lambda go'')$$
$$= \Psi b \cdot \{xe(\lambda bo) + Fxbo \cdot \Delta \lambda b\} + \psi b \cdot xe(\lambda go'')$$
$$Yb = \Psi b \cdot \{ye(\lambda bo) + Fybo \cdot \Delta \lambda b\} + \psi b \cdot ye(\lambda go'')$$
$$Zb = \Psi b \cdot \{ze(\lambda bo) + Fzbo \cdot \Delta \lambda b\} + \psi b \cdot ze(\lambda go'')$$

(Expression 26)

The normal wavelength λgo′ of the G-color additional light (Fba) and the normal wavelength λgo of the G-color main component light (Fgm) of the G-color output luminous flux (Fg) may be the same as or different from each other.

For the sake of convenience, the sum of the tristimulus values X, Y, and Z is represented by T. When the respective sums for the R-color output luminous flux (Fr), the G-color output luminous flux (Fg), and the B-color output luminous flux (Fb) are calculated by the following expressions (expression 27), the y-coordinates (yr, yg, yb) of the chromaticity coordinates of the R-color output luminous flux (Fr), the G-color output luminous flux (Fg), and the B-color output luminous flux (Fb) are represented by the following expressions (expression 28) with use of the tristimulus value Yr in the expression 24 for the R-color output luminous flux, the tristimulus value Yg in the expression 25 for the G-color output luminous flux, and the tristimulus value Yb in the expression 2 for the B-color output luminous flux, and sums Ψr, Ψg, and Ψb in the expression 27.

$$Tr = Xr + Yr + Zr$$
$$Tg = Xg + Yg + Zg$$
$$Tb = Xb + Yb + Zb \quad \text{(Expression 27)}$$
$$yr = Yr/Tr$$
$$yg = Yg/Tg$$
$$yb = Yb/Tb \quad \text{(Expression 28)}$$

When these y-coordinates yr, yg, and yb and the target values yrp, ygp, and ybp thereof have a difference therebetween, it is considered that the luminous flux intensity indicating values ψr, ψg, and ψb are so adjusted as to eliminate the difference.

First, regarding the R-color output luminous flux (Fr), when the y-coordinate yr is regarded as a function having the luminous flux intensity indicating value ψr as a variable, gradient when the y-coordinate yr is varied with variation of the luminous flux intensity indicating value ψr is given by the following expression (expression 29) obtained by differentiating the first expression of the expression 28 with the luminous flux intensity indicating value ψr, and variation Δψr of the luminous flux intensity indicating value ψr that is necessary to eliminate a difference Δyr between the y-coordinate yr and the target value yrp thereof is determined by the following expressions (expression 30) through a dumping coefficient D from 0 to 1.

$$dyr/d\psi r = \{dYr/d\psi r \cdot Tr - Yr \cdot dTr/d\psi r\}/\{Tr \cdot Tr\} \quad \text{(Expression 29)}$$
$$= \{ye(\lambda go') \cdot Tr - Yr \cdot \{xe(\lambda go') + ye(\lambda go') + ze(\lambda go')\}\}/\{Tr \cdot Tr\}$$
$$= \{ye(\lambda go') - yr \cdot \{xe(\lambda go') + ye(\lambda go') + ze(\lambda go')\}\}/Tr$$

$$\Delta \psi r = \Delta yr/(dyr/d\psi r) \quad \text{(Expression 30)}$$
$$= D \cdot \{yrp - yr\}/(dyr/d\psi r)$$

The ratio hr of the luminous flux intensity indicating value ψr to the luminous flux intensity indicating value Ψr may be updated with use of the variation Δψr as represented by the following expressions (expression 31).

$$hr = \psi r/\Psi r \to hr = \{\psi r + \Delta \psi r\}/\Psi r \quad \text{(Expression 31)}$$

Likewise, regarding the G-color output luminous flux (Fg), the following expression (Expression 32) giving gradient when the y-coordinate yg is varied with variation of the luminous flux intensity indicating value ψg is applied to the following expression (expression 33) giving variation Δψg of the luminous flux intensity indicating value ψg that is necessary to achieve the target value ygp of the y-coordinate through the dumping coefficient D, and the ratio hg of the luminous flux intensity indicating value ψg to the luminous flux intensity value Ψg is updated by the following expression (expression 34).

$$dyg/d\psi g = \{dYg/d\psi g \cdot Tg - Yg \cdot dTg/d\psi g\}/\{Tg \cdot Tg\} \quad \text{(Expression 32)}$$
$$= \{ye(\lambda ro') \cdot Tg - Yg \cdot \{xe(\lambda ro') + ye(\lambda ro') + ze(\lambda ro')\}\}/\{Tg \cdot Tg\}$$
$$= \{ye(\lambda ro') - yg \cdot \{xe(\lambda ro') + ye(\lambda ro') + ze(\lambda ro')\}\}/Tg$$

$$\Delta \psi g = \Delta yg/(dyg/d\psi g) \quad \text{(Expression 33)}$$
$$= D \cdot \{ygp - yg\}/(dyg/d\psi g)$$

$$hg = \psi g/\Psi g \to hg = \{\psi g + \Delta \psi g\}/\Psi g \quad \text{(Expression 34)}$$

The expressions 32, 33, and 34 correspond to a case where the G-color output luminous flux (Fg) is located at the chromaticity coordinate point (cg) in FIG. 4. When the G-color output luminous flux (Fg) is located at the chromaticity coordinate point (cg′), the expressions 32, 33, and 34 are applicable by replacing the normal wavelength λro′ by the normal wavelength λbo′.

Likewise, regarding the B-color output luminous flux (Fb), the following expression (expression 35) giving gradient when the y-coordinate yb is varied with variation of the luminous flux intensity indicating value ψb is applied to the following expression (expression 36) giving variation Δψb of the luminous flux intensity indicating value ψb that is necessary to achieve the target value ybp of the y-coordinate through the dumping coefficient D, and the ratio hb of the luminous flux intensity indicating value ψb to the luminous flux intensity value Ψb is updated by the following expression (expression 37).

$$dyb/d\psi b = \{dYb/d\psi b \cdot Tb - Yb \cdot dTb/d\psi b\}/\{Tb \cdot Tb\} \quad \text{(Expression 35)}$$
$$= \{ye(\lambda go'') \cdot Tb - Yb \cdot \{xe(\lambda go'') + ye(\lambda go'') + ze(\lambda go'')\}\}/\{Tb \cdot Tb\}$$
$$= \{ye(\lambda go'') - yb \cdot \{xe(\lambda go'') + ye(\lambda go'') + ze(\lambda go'')\}\}/Tb$$

$$\Delta \psi b = \Delta yb/(dyb/d\psi b) \quad \text{(Expression 36)}$$
$$= D \cdot \{ybp - yb\}/(dyb/d\psi b)$$

-continued $$hb = \psi b/\Psi b \rightarrow hb = \{\psi b + \Delta \psi b\}/\Psi b \quad \text{(Expression 37)}$$

When The G-color output luminous flux (Fg) includes additional light (Fga) of both R-color and B-color corresponding to the chromaticity coordinate point (cg") in FIG. 4, as described above, the normal wavelength of the additional light may be one of the normal wavelengths λro' and λbo', and the luminous flux intensity indicating value ψg may be of the of the light emitting element that emits light at that time. When the normal wavelength of the additional light is the wavelength λro', the x-coordinate of the G-color output luminous flux (Fg) is represented by the following expression (expression 38) by the tristimulus value Xg in the expression 25 and the sum Ψg in the expression 27. The following expression (expression 39) that gives gradient when the x-coordinate xg is varied with variation of the luminous flux intensity indicating value ψg and is obtained by differentiating the expression 38 with the luminous flux intensity indicating value ψg is applied to the following expression (expression 40) that gives variation Δψg of the luminous flux intensity indicating value ψg necessary to achieve the target value xgp of the x-coordinate through the dumping coefficient D. The ratio hg of the luminous flux intensity indicating value ψg to the luminous flux intensity value Ψg is updated by the above-described expression 34.

$$xg = Xg/Tg \quad \text{(Expression 38)}$$

$$\begin{aligned}dxg/d\psi g &= \{dXg/d\psi g \cdot Tg - Xg \cdot dTg/d\psi g\}/\{Tg \cdot Tg\} \quad \text{(Expression 39)}\\ &= \{xe(\lambda ro') \cdot Tg - Xg \cdot \{xe(\lambda ro') + \\ & \quad xe(\lambda ro') + ze(\lambda ro')\}\}/\{Tg \cdot Tg\}\\ &= \{xe(\lambda ro') - xg \cdot \{xe(\lambda ro') + \\ & \quad xe(\lambda ro') + ze(\lambda ro')\}\}/Tg\end{aligned}$$

$$\begin{aligned}\Delta \psi g &= \Delta xg/(dxg/d\psi g) \quad \text{(Expression 40)}\\ &= D \cdot \{xgp - xg\}/(dxg/d\psi g)\end{aligned}$$

A procedure to determination of the luminous flux intensity indicating values Ψr, Ψg, and Ψb respectively relating to R-color main component light (Frm), the G-color main component light (Fgm), and the B-color main component light (Fbm), deviation from the normal wavelength Δλr, Δλg, and Δλb as the wavelength deviation indicating values, and the luminous flux intensity indicating values ψr, ψg, and ψb respectively relating to the additional light (Fra) forming the R-color output luminous flux (Fr), the additional light (Fga) forming the G-color output luminous flux (Fg), and the additional light (Fba) forming the B-color output luminous flux (Fb), and thereafter updating of the ratios hr, hg, and hb of the luminous flux intensity indicating values ψr, ψg, and ψb to the luminous flux intensity indicating values Ψr, Ψg, and Ψb with use of these values is summarized as follows.

First, out of the following values, necessary values are prepared in advance as the local color band color matching function information relating to the color matching functions xe(λ), ye(λ), and ze(λ). Non-limiting examples of the values may include the values of the color matching functions xe(λ), ye(λ), and ze(λ) at the normal wavelengths λro, λgo, and λbo of the R-color main component light (Frm), the G-color main component light (Fgm), and the B-color main component light (Fbm), namely, xe(λro), ye(λro), ze(λro), xe(λgo), ye(λgo), ze(λgo), xe(λbo), ye(λbo), and ze(λbo), the rates of function output varying against wavelength varying Fxro, Fyro, Fzro, Fxgo, Fygo, Fzgo, Fxbo, Fybo, and Fzbo based on the expressions 20, 21, and 22, and the values of the color matching functions at the normal wavelengths λro, λgo, and λbo of the additional light (Fra) forming the R-color output luminous flux (Fr), the additional light (Fga) forming the G-color output luminous flux (Fg), and the additional light (Fba) forming the B-color output luminous flux (Fb), namely, xe(λgo'), ye(λgo'), ze(λgo'), xe(λgo"), ye(λgo"), ze(λgo"), xe(λro'), ye(λro'), ze(λro'), xe(λbo'), ye(λbo), and ze(λbo).

The prepared values are applied to the expressions 24, 25, and 26 to determine the tristimulus values Xr, Yr, Zr, Xg, Yg, Zg, Xb, Yb, and Zb for the R-color output luminous flux (Fr), the G-color output luminous flux (Fg), and the B-color output luminous flux (Fb), and the prepared values are applied to the expression 28 to determine the values of the y-coordinates yr, yg, and yb of the chromaticity coordinates.

These values are applied to the expressions 29, 32, and 35 to determine values of gradient when the y-coordinates yr, yg, and yb are varied with variation of the luminous flux intensity indicating values ψr, ψg, and ψb, and variation Δψr, Δψg, and Δψb of the luminous flux intensity indicating values ψr, ψg, and ψb that are suitable to achieve the target values yrp, ygp, and ybp of the y-coordinates of the chromaticity coordinates of the R-color output luminous flux (Fr), the G-color output luminous flux (Fg), and the B-color output luminous flux (Fb) are determined by the expressions 30, 33, and 36 through an appropriate dumping coefficient D from 0 to 1. Thus, the ratios hr, hg, and hb of the luminous flux intensity indicating values ψr, ψg, and ψb to the luminous flux intensity indicating values Ψr, Ψg, and Ψb are updated by the expressions 31, 34, and 37. When the G-color output luminous flux is located at the chromaticity coordinate point (cg"), the variation Δψg that achieves the target value xgp is determined based on the expression 40

The above-described updating of the values of the ratio hr, hg, and hb is executed in the feedback control loop for maintaining the color of the after-mentioned integrated light of the R-color output luminous flux (Fr), the G-color output luminous flux (Fg), and the B-color output luminous flux (Fb) at the target value, and correction is constantly performed in a feedback manner so as to reduce difference between the values and the target value thereof. Note that the variation Δψr, Δψg, and Δψb are suppressed to small with the decrease of the above-described dumping coefficient, which exhibits an effect of preventing unstable phenomenon such as overrun and oscillation of the feedback control. Incidentally, the dumping coefficient may be preferably determined experimentally to suitable value since excessively small value may cause inconvenience, for example, excess time is necessary to complete correction.

The method of achieving the target values of the y-coordinates of the chromaticity coordinates of the R-color output luminous flux (Fr), the G-color output luminous flux (Fg), and the B-color output luminous flux (Fb) by the feedback control has been described. This method has an advantage that the target value is properly maintained. It is because even if the relationship between output power pr to the light emitting elements for the additional light (Fra) of the R-color output luminous flux (Fr) and the luminous flux intensity indicating value ψr of the additional light (Fra), a relationship between output power pg to the light emitting elements for the additional light (Fga) of the G-color output luminous flux (Fg) and the luminous flux intensity indicating value ψg of the additional light (Fga), and a relationship between output power pb to the light emitting element for the additional light (Fba) of the B-color output luminous flux (Fb) and the luminous flux intensity indicating value ψb of the additional light (Fba) each have nonlinearity, correction is properly performed in a feedback manner.

When these relationships do not have the nonlinearity or have sufficiently week nonlinearity because of a certain reason such as a sufficiently large margin for rated power of the output power to each of the light emitting elements for the additional light, the value of the ratio hr, hg, and hb may be determined by direct calculation without the feedback control. Such a determination method by direction calculation is described below.

The following expression (Expression 41) is obtained by the second expression of the expression 24, the first expression of the expression 27, and the first expression of the expression 28. When the ratio ψr/Ψr of the luminous flux intensity indicating value of the additional light (Fga) to the luminous flux intensity indicating value of the main component light (Frm) is determined by the expression 41, the following expression (Expression 41') is obtained.

$$yr \cdot \Psi r \cdot \{xe(\lambda ro) + Fxro \cdot \Delta \lambda r + ye(\lambda ro) + Fyro \cdot \Delta \lambda r + ze(\lambda ro) + Fzro \cdot \Delta \lambda r\} + $$
$$yr \cdot \psi r \cdot \{xe(\lambda go') + ye(\lambda go') + ze(\lambda go')\} = $$
$$\Psi r \cdot \{ye(\lambda ro) + Fyro \cdot \Delta \lambda r\} + \psi r \cdot ye(\lambda go') \quad \text{(Expression 41)}$$

$$hr = \psi r / \Psi r \quad \text{(Expression 41')}$$
$$= \{ye(\lambda ro) + Fyro \cdot \Delta \lambda r - $$
$$yr \cdot \{xe(\lambda ro) + Fxro \cdot \Delta \lambda r + $$
$$ye(\lambda ro) + Fyro \cdot \Delta \lambda r + $$
$$ze(\lambda ro) + Fzro \cdot \Delta \lambda r\}\} / $$
$$\{yr \cdot \{xe(\lambda go') + ye(\lambda go') + $$
$$ze(\lambda go')\} - ye(\lambda go')\}$$

In a case where the G-color output luminous flux is located at the chromaticity coordinate point (cg) in FIG. 4, when the ratio ψg/Ψg is determined, the following expression (Expression 42) is obtained in a similar manner.

$$hg = \psi g / \Psi g \quad \text{(Expression 42)}$$
$$= \{ye(\lambda go) + Fygo \cdot \Delta \lambda g - $$
$$yg \cdot \{xe(\lambda go) + Fxgo \cdot \Delta \lambda g + $$
$$ye(\lambda go) + Fygo \cdot \Delta \lambda g + $$
$$ze(\lambda go) + Fzgo \cdot \Delta \lambda g\}\} / $$
$$\{yg \cdot \{xe(\lambda ro') + ye(\lambda ro') + $$
$$ze(\lambda ro')\} - ye(\lambda ro')\}$$

When the G-color output luminous flux is located at the chromaticity coordinate point (cg'), the expression 42 is applicable by replacing the normal wavelength λro' by the normal wavelength λbo'.

Moreover, when the ratio ψb/Ψb is determined, the following expression (Expression 43) is obtained in a similar manner.

$$hb = \psi b / \Psi b \quad \text{(Expression 43)}$$
$$= \{ye(\lambda bo) + Fybo \cdot \Delta \lambda b - $$

-continued
$$yb \cdot \{xe(\lambda bo) + Fxbo \cdot \Delta \lambda b + $$
$$ye(\lambda bo) + Fybo \cdot \Delta \lambda b + $$
$$ze(\lambda bo) + Fzbo \cdot \Delta \lambda b\}\} / $$
$$\{yb \cdot \{xe(\lambda go'') + ye(\lambda go'') + $$
$$ze(\lambda go'')\} - ye(\lambda go'')\}$$

In a case where the G-color output luminous flux includes additional light (Fga) of both R-color and B-color corresponding to the chromaticity coordinate point (cg") in FIG. 4 as described above, the normal wavelength of the additional light is one of the wavelengths λro' and λbo'. In a case where the normal wavelength of the additional light is the wavelength λro', when the ratio ψg/Ψg is determined by the first expression of the expression 25, the second expression of the expression 27, and the following expression (Expression 44), the following expression (Expression 45) is obtained.

$$xg = Xg / Tg \quad \text{(Expression 44)}$$

$$hg = \psi g / \Psi g \quad \text{(Expression 45)}$$
$$= \{xe(\lambda go) + Fxgo \cdot \Delta \lambda g - $$
$$yg \cdot \{xe(\lambda go) + Fxgo \cdot \Delta \lambda g + $$
$$ye(\lambda go) + Fxgo \cdot \Delta \lambda g + $$
$$ze(\lambda go) + Fzgo \cdot \Delta \lambda g\}\} / $$
$$\{xg \cdot \{xe(\lambda ro') + ye(\lambda ro') + $$
$$ze(\lambda ro')\} - ye(\lambda ro')\}$$

Next, regarding the integrated light of the R-color output luminous flux (Fr), the G-color output luminous flux (Fg), and the B-color output luminous flux (Fb), description is given of determination of variation ΔΨr, ΔΨg, and ΔΨb when the luminous flux intensity indicating values Ψr, Ψg, and ΔΨb are slightly varied, in order to perform feedback control such that the tristimulus values X, Y, and Z are maintained to the target values thereof or the chromaticity coordinates x and y and the brightness of light Y are maintained to the target values thereof.

As described above, focusing on the chromaticity coordinates x and y as the color-phase indicating values correlated with the color of light and focusing on the value Y as the brightness indicating value correlated with the brightness of light, stabilization control thereof has been described. However, the system of x, y, and Y and the system of X, Y, and Z may be converted from each other by the above-described expression 2 and the following expressions (expression 19). Therefore, the tristimulus values are values correlated with the chromaticity coordinates. Consequently, any of the chromaticity coordinates and the tristimulus values may be employed as the color-phase indicating values correlated with the color of light.

$$\lambda = Y \cdot x / y$$

$$Z = Y \cdot (1 - x - y) / y \quad \text{(Expression 19)}$$

As described above, even in the case of values in the other color system, the values may be employed in a similar manner as long as the values are correlated with the chromaticity coordinates. Therefore, regarding the integrated light of the R-color output luminous flux (Fr), the G-color output luminous flux (Fg), and the B-color output luminous flux (Fb), a case where the tristimulus values X, Y, and Z are control targets and are controlled to be maintained to the target values Xp, Yp, and Zp is first described.

The tristimulus values X, Y, and Z of the integrated light of the R-color output luminous flux (Fr), the G-color output luminous flux (Fg), and the B-color output luminous flux (Fb) are determined by the sums of respective components of the tristimulus values X, Y, and Z of the respective color luminous fluxes represented by the expressions 24, 25, and 26. The following expressions (expression 46), (expression 47), and (expression 48) are respectively obtained for the tristimulus values X, Y, and Z.

$$X = Xr + Xg + Xb \quad \text{(Expression 46)}$$
$$= \Psi r \cdot \{xe(\lambda ro) + Fxro \cdot \Delta \lambda r\} + \psi r \cdot xe(\lambda go') +$$
$$\Psi g \cdot \{xe(\lambda go) + Fxgo \cdot \Delta \lambda g\} + \psi g \cdot xe(\lambda ro') +$$
$$\Psi b \cdot \{xe(\lambda bo) + Fxbo \cdot \Delta \lambda b\} + \psi b \cdot xe(\lambda go'')$$
$$= Hxr \cdot \Psi r + Hxg \cdot \Psi g + Hxb \cdot \Psi b$$

where
$Hxr = xe(\lambda ro) + Fxro \cdot \Delta \lambda r + hr \cdot xe(\lambda go')$
$Hxg = xe(\lambda go) + Fxgo \cdot \Delta \lambda g + hg \cdot xe(\lambda ro')$
$Hxb = xe(\lambda bo) + Fxbo \cdot \Delta \lambda b + hb \cdot xe(\lambda go'')$ $$Y = Yr + Yg + Yb \quad \text{(Expression 47)}$$
$$= \Psi r \cdot \{ye(\lambda ro) + Fyro \cdot \Delta \lambda r\} + \psi r \cdot ye(\lambda go') +$$
$$\Psi g \cdot \{ye(\lambda go) + Fygo \cdot \Delta \lambda g\} + \psi g \cdot ye(\lambda ro') +$$
$$\Psi b \cdot \{ye(\lambda bo) + Fybo \cdot \Delta \lambda b\} + \psi b \cdot ye(\lambda go'')$$
$$= Hyr \cdot \Psi r + Hyg \cdot \Psi g + Hyb \cdot \Psi b$$

where
$Hyr = ye(\lambda ro) + Fyro \cdot \Delta \lambda r + hr \cdot ye(\lambda go')$
$Hyg = ye(\lambda go) + Fygo \cdot \Delta \lambda g + hg \cdot ye(\lambda ro')$
$Hyb = ye(\lambda bo) + Fybo \cdot \Delta \lambda b + hb \cdot ye(\lambda go'')$ $$Z = Zr + Zg + Zb \quad \text{(Expression 48)}$$
$$= \Psi r \cdot \{ze(\lambda ro) + Fzro \cdot \Delta \lambda r\} + \psi r \cdot ze(\lambda go') +$$
$$\Psi g \cdot \{ze(\lambda go) + Fzgo \cdot \Delta \lambda g\} + \psi g \cdot ze(\lambda ro') +$$
$$\Psi b \cdot \{ze(\lambda bo) + Fzbo \cdot \Delta \lambda b\} + \psi b \cdot ze(\lambda go'')$$
$$= Hzr \cdot \Psi r + Hzg \cdot \Psi g + Hzb \cdot \Psi b$$

where
$Hzr = ze(\lambda ro) + Fzro \cdot \Delta \lambda r + hr \cdot ze(\lambda go')$
$Hzg = ze(\lambda go) + Fzgo \cdot \Delta \lambda g + hg \cdot ze(\lambda ro')$
$Hzb = ze(\lambda bo) + Fzbo \cdot \Delta \lambda b + hb \cdot ze(\lambda go'')$ The variation $\Delta \lambda$, $\Delta Y$, and $\Delta Z$ of the tristimulus values X, Y, and Z when the luminous flux intensity indicating values $\Psi r$, $\Psi g$, and $\Psi b$ are slightly varied are represented by the following expression (expression 49) based on the expressions 46, 47, and 48.

$$\Delta X = Hxr \cdot \Delta \Psi r + Hxg \cdot \Delta \Psi g + Hxb \cdot \Delta \Psi b$$
$$\Delta Y = Hyr \cdot \Delta \Psi r + Hyg \cdot \Delta \Psi g + Hyb \cdot \Delta \Psi b$$
$$\Delta Z = Hzr \cdot \Delta \Psi r + Hzg \cdot \Delta \Psi g + Hzb \cdot \Delta \Psi b \quad \text{(Expression 49)}$$

In this way, the variation of the integrated color-phase indicating value when the luminous flux intensity indicating values for the R-color output luminous flux (Fr), the G-color output luminous flux (Fg), and the B-color output luminous flux (Fb) are slightly varied is represented by the linear operation with use of the variation of the luminous flux intensity indicating values, and the coefficients at that time are determined with use of the luminous flux intensity indicating values and the wavelength deviation indicating values for the R-color output luminous flux (Fr), the G-color output luminous flux (Fg), and the B-color output luminous flux (Fb).

In the feedback control, when considering that the slight variation $\Delta \Psi r$, $\Delta \Psi g$, and $\Delta \Psi b$ are added to the luminous flux intensity indicating values $\Psi r$, $\Psi g$, and $\Psi b$ in order to allow the current tristimulus values X, Y, and Z to approach the respective target values Xp, Yp, and Zp, the values $\Delta \lambda$, $\Delta Y$, and $\Delta Z$ are determined by the following expressions (expression 50), where a dumping coefficient D is from 0 to 1. As a result, the above-described expression 49 is regarded as an elemental simultaneous linear equation with three unknowns relating to the slight variation $\Delta \Psi r$, $\Delta \Psi g$, and $\Delta \Psi b$. Since all of the coefficients thereof are determined, the expression 49 is easily solved to determine the slight variation $\Delta \Psi r$, $\Delta \Psi g$, and $\Delta \Psi b$ of the light emitting intensity indicating values.

$$\Delta X = D \cdot \{Xp - X\}$$
$$\Delta Y = D \cdot \{Yp - Y\}$$
$$\Delta Z = D \cdot \{Zp - Z\} \quad \text{(Expression 50)}$$

According to the above-described expression 17, the determined slight variation $\Delta \Psi r$, $\Delta \Psi g$, and $\Delta \Psi b$ are added to the original luminous flux intensity indicating values $\Psi r$, $\Psi g$, and $\Psi b$ to calculate new target values $\Psi rp$, $\Psi gp$, and $\Psi$ of the luminous flux intensity indicating values. Then, the total output power Pr, Pg, and Pb of the drive circuits (Pr1, Pr2, ..., Pra, Pg1, Pg2, ..., Pb1, Pb2, ..., Pba) are updated through the above-described expression 13.

Incidentally, the luminous flux intensity indicating values $\Psi r$, $\Psi g$, and $\Psi b$ are respectively the luminous flux intensity indicating value relating to the R-color main component light (Frm), G-color main component light (Fgm), and the B-color main component light (Fbm), as described above, and are not the luminous flux intensity indicating values of the R-color output luminous flux (Fr), the G-color output luminous flux (Fg), and the B-color output luminous flux (Fb). In a certain step in the feedback control loop, once the ratios hr, hg, and hb of the luminous flux intensity indicating values $\psi r$, $\psi g$, and $\psi b$ to the luminous flux intensity indicating values $\Psi r$, $\Psi g$, and $\Psi b$ are determined, the output power of the drive circuits (Pr1, Pr2, ..., Pra, Pg1, Pg2, ..., Pb1, Pb2, ..., Pba) are set according to the above-described expression 15 until updating these values. Accordingly, the shape of the spectrum of the luminous flux is determined, and when the value of intensity at a certain wavelength is determined, the value is correlated with intensity of the entire luminous flux.

The way of the feedback control of the variation of the tristimulus values X, Y, and Z as the integrated color-phase indicating value when the luminous flux intensity indicating values $\Psi r$, $\Psi g$, and $\Psi b$ are slightly varied after updating the ratios hr, hg, and hb of the luminous flux intensity indicating values $\psi r$, $\psi g$, and $\psi b$ to the luminous flux intensity indicating values $\Psi r$, $\Psi g$, and $\Psi b$ through the expression 49 represented by the linear operation, with use of the variation of the luminous flux intensity indicating values $\Psi r$, $\Psi g$, and $\Psi b$ is summarized as follows.

First, the values of the coefficients Hxr, Hxg, Hxb, Hyr, Hyg, Hyb, Hzr, Hzg, and Hzb dependent on the deviation from normal wavelength $\Delta \lambda r$, $\Delta \lambda g$, and $\Delta \lambda b$ and the ratios hr, hg, and hb are prepared in advance according to the expressions 46, 47, and 48. The tristimulus values X, Y, and Z that are calculated through the expressions 46, 47, and 48 based on the luminous flux intensity indicating values Ψr, Ψg, and Ψb and the target values Xp, Yp, and Zp thereof are applied to the expression 50. As a result, the left side of the expression 49 is determined. Thus, the expression 49 is regarded as the simultaneous linear equation with three unknowns and solved to determine the slight variation ΔΨr, ΔΨg, and ΔΨb of the luminous flux intensity indicating values.

The control circuit (Mc) applies, with respect to the current values Ψr, Ψg, and Ψb of the luminous flux intensity indicating values, the determined slight variation ΔΨr, ΔΨg, and ΔΨb to the expression 17 to calculate new target values Ψrp, Ψgp, and Ψbp of the luminous flux intensity indicating values. The control circuit (Mc) then updates the total output power Pr, Pg, and Pb of the drive circuits (Pr1, Pr2, . . . , Pg1, Pg2, . . . , Pb1, Pb2, and . . . ) according to the expression 13. The control circuit (Mc) applies the ratios hr, hg, and hb having already been determined to the expression 15 to determine the target values ψrp, ψgp, and ψbp of the luminous flux intensity indicating values ψr, ψg, and ψb. The control circuit (Mc) then updates the total output power Pr, Pg, and Pb of the drive circuits (Pra, Pga, Pba, . . . ) according to the expression 14. The control circuit (Mc) then returns to the operation of acquiring the luminous flux chromaticity-intensity correlation data (Dr, Dg, Db). Subsequently, the above-described sequence is repeated to build the feedback control loop.

Note that the variation ΔΨr, ΔΨg, and ΔΨb are suppressed to small with the decrease of the above-described dumping coefficient, which exhibits an effect of preventing unstable phenomenon such as overrun and oscillation of the feedback control. Incidentally, the dumping coefficient may be preferably determined experimentally to suitable value since excessively small value may cause inconvenience, for example, excess time is necessary to complete correction.

In the case where one of the luminous flux intensity indicating values Ψr, Ψg, and Ψb, for example, Ψr is determined separately for any reason (for example, in a case of reaching rating), the target values Xp, Yp, and Zp of the tristimulus values are not met. It is necessary to change control system so that the color of light is maintained to a target color while giving up maintaining the brightness of light. In a case of a method of performing control such that the above-described tristimulus values X, Y, and Z are maintained to the target values Xp, Yp, and Zp, for example, when the brightness of light is reduced such that the luminous flux intensity indicating value Ψr becomes a predetermined value while maintaining the target color of light, the target values Xp, Yp, and Zp of the tristimulus values are tentatively reduced at the same rate appropriately determined, and the feedback loop is actually performed through trial and error until an appropriate rate such that the luminous flux intensity indicating value Ψr becomes the predetermined value is found.

When the chromaticity coordinates x and y that are the color-phase indicating values correlated with the color of light and the value Y that is the brightness indicating value correlated with the brightness of light are target of control, and if the control system of maintaining the values x, y, and Y to the target values xp, yp, and Yp is achieved, for example, it becomes possible to perform the feedback control to maintain only the chromaticity coordinates x and y to the target values while the value Ψr is fixed. A case where the control targets are the values x, y, and Y and control is performed such that the values x, y, and Y are maintained to the target values xp, yp, and Yp is described below.

When the above-described expressions 46, 47 and 48 relating to the tristimulus values X, Y, and Z are applied in order to calculate the chromaticity coordinates x and y, the following expression (expression 51) relating to sum of the tristimulus values X, Y, and Z is obtained.

$$T = X + Y + Z$$
$$= \{Hxr + Hyr + Hzr\} \cdot \Psi r +$$
$$\{Hxg + Hyg + Hzg\} \cdot \Psi g +$$
$$\{Hxb + Hyb + Hzb\} \cdot \Psi b$$
$$= Ir \cdot \Psi r + Ig \cdot \Psi g + Ib \cdot \Psi b \quad \text{(Expression 51)}$$

where $$Ir = Hxr + Hyr + Hzr$$
$$Ig = Hxg + Hyg + Hzg$$
$$Ib = Hxb + Hyb + Hzb$$

Accordingly, the chromaticity coordinates x and y in the above-described expression 2 relating to the luminous flux to be measured S(λ) are calculated by the following expressions (expression 52) using the above-described expressions 46, 47, and 51.

$$x = X/T$$
$$y = Y/T \quad \text{(Expression 52)}$$

Typically, variation in the function f=ff(u, v, w) when variables u, v, and w of the function f are slightly varied is approximated to the following expression (expression 53) with use of partial derivatives δf/δu, δf/δv, and δf/δw of the function f.

$$\Delta f = (\delta f/\delta u) \cdot \Delta u + (\delta f/\delta v) \cdot \Delta v + (\delta f/\delta w) \cdot \Delta w \quad \text{(Expression 53)}$$

When the chromaticity coordinates x and y and the brightness of light Y are regarded as functions including the luminous flux intensity indicating values Ψr, Ψg, and Ψb as variables, the values of the partial derivatives are specifically determined as the following expressions (expression 54). Accordingly, the variation of the chromaticity coordinates x and y and the brightness of light Y when the luminous flux intensity indicating values Ψr, Ψg, and Ψb are slightly varied are represented by the following expressions (expression 55).

$$Jxr = \delta x/\delta \Psi r \quad \text{(Expression 54)}$$
$$= \{\delta X/\delta \Psi r \cdot T - X \cdot \delta T/\delta \Psi r\}/\{T \cdot T\}$$
$$= \{Hxr \cdot T - Ir \cdot X\}/\{T \cdot T\}$$
$$= \{Hxr - Ir \cdot x\}/T$$

$$Jxg = \delta x/\delta \Psi g = \{Hxg - Ig \cdot x\}/T$$
$$Jxb = \delta x/\delta \Psi b = \{Hxb - Ib \cdot x\}/T$$
$$Jyr = \delta y/\delta \Psi r = \{Hyr - Ir \cdot y\}/T$$
$$Jyg = \delta y/\delta \Psi g = \{Hyg - Ig \cdot y\}/T$$
$$Jyb = \delta y/\delta \Psi b = \{Hyb - Ib \cdot y\}/T$$

$$\Delta x = Jxr \cdot \Delta \Psi r + Jxg \cdot \Delta \Psi g + Jxb \cdot \Delta \Psi b \quad \text{(Expression 55)}$$
$$\Delta y = Jyr \cdot \Delta \Psi r + Jyg \cdot \Delta \Psi g + Jyb \cdot \Delta \Psi b$$
$$\Delta Y = Hyr \cdot \Delta \Psi r + Hyg \cdot \Delta \Psi g + Hyb \cdot \Delta \Psi b$$

In this way, the variation of the integrated color-phase indicating value when the luminous flux intensity indicating values for the R-color output luminous flux (Fr), the G-color output luminous flux (Fg), and the B-color output luminous flux (Fb) are slightly varied is represented by linear operation with use of the variation of the luminous flux intensity indicating values. In addition, the coefficients at that time are determined with use of the luminous flux intensity indicating values and the wavelength deviation indicating values for the R-color output luminous flux (Fr), the G-color output luminous flux (Fg), and the B-color output luminous flux (Fb).

Incidentally, the third expression (relating to the variation ΔY) in the expression 55 is based on the following relationship obtained from the expression 47.

$$\delta Y/\delta \Psi r = Hyr$$

$$\delta Y/\delta \Psi g = Hyg$$

$$\delta Y/\delta \Psi b = Hyb$$

As described regarding the expression 55, it is considered that the luminous flux intensity indicating values Ψr, Ψg, and Ψb are slightly varied in order to allow the current values x, y, and Y to approach the target values xp, yp, and Yp in the feedback control. When the dumping coefficient D is from 0 to 1, the variation Δx, Δy, and ΔY are determined by the following expressions (expression 56). As a result, the above-described expression 55 is regarded as an essential simultaneous linear equation with three unknowns relating to the slight variation ΔΨr, ΔΨg, and ΔΨb of the luminous flux intensity indicating values. Since all of the coefficients are determined, the equation is easily solved to determine the values of the slight variation ΔΨr, ΔΨg, and ΔΨb of the light emitting intensity indicating values.

$$\Delta x = D \cdot \{xp - x\}$$

$$\Delta y = D \cdot \{yp - y\}$$

$$\Delta Y = D \cdot \{Yp - Y\} \quad \text{(Expression 56)}$$

The way of the feedback control of the variation of the chromaticity coordinates x and y and the brightness of light Y as the integrated color-phase indicating values when the luminous flux intensity indicating values Ψr, Ψg, and Ψb are slightly varied after updating the ratios hr, hg, and hb of the luminous flux intensity indicating values ψr, ψg, and ψb to the luminous flux intensity indicating values Ψr, Ψg, and Ψb through the expression 55 represented by the linear operation, with use of the variation of the luminous flux intensity indicating values Ψr, Ψg, and Ψb is summarized as follows.

The luminous flux intensity indicating values Ψr, Ψg, and Ψb and the value of deviation from normal wavelength Δλr, Δλg, and Δλb are applied to the expressions 46, 47, and 51. As a result, the tristimulus values X and Y and the value T are obtained through auxiliary coefficients Hxr, Hxg, Hxb, Hyr, Hyg, Hyb, Hzr, Hzg, Hzb, Ir, Ig, and Ib. Then, it is possible to determine the values of the chromaticity coordinates x and y by applying the obtained values to the above-described expression 52. When the determined values x, y, and Y and the target values xp, yp, and Yp are applied to the above-described expression 56, the left side of the above-described expression 55 is determined. In addition, the coefficients on the right side of the expression 55 are determined by the coefficients Jxr, Jxg, Jxb, Jyr, Jyg, and Jyb in the expression 54. Therefore, the expression 55 is regarded as the simultaneous linear equation with three unknowns and is solved to determine the values of the slight variation ΔΨr, ΔΨg, and ΔΨb of the luminous flux intensity indicating values.

The control circuit (Mc) applies, with respect to the current values Ψr, Ψg, and Ψb of the luminous flux intensity indicating values, the determined slight variation ΔΨr, ΔΨg, and ΔΨb to the expression 17 to calculate new target values Ψrp, Ψgp, and Ψ of the luminous flux intensity indicating values. The control circuit (Mc) then updates the total output power Pr, Pg, and Pb of the drive circuits (Pr1, Pr2, . . . , Pg1, Pg2, . . . , Pb1, Pb2, . . . ) according to the expression 13. The control circuit (Mc) applies the ratios hr, hg, and hb having already been determined to the expression 15 to determine the target values ψrp, ψgp, and ψbp of the luminous flux intensity indicating values ψr, ψg, and ψb. The control circuit (Mc) then updates the total output power Pr, Pg, and Pb of the drive circuits (Pra, Pga, Pba, . . . ) according to the expression 14. The control circuit (Mc) then returns to the operation of acquiring the luminous flux chromaticity-intensity correlation data (Dr, Dg, Db). Subsequently, the above-described sequence is repeated to build the feedback control loop.

In the case where variation of one of the luminous flux intensity indicating values Ψr, Ψg, and Ψb, for example, ΔΨr is determined separately for any reason (for example, in a case of reaching rating), the luminous flux intensity indicating value Ψr is regarded not as the unknown value, but as a constant in the expression 55 to apply the following expressions (expression 57) that are obtained by modifying the expression 55. The expression 57 is an elemental simultaneous linear equation with two unknowns, which is easily solved. Therefore, it is possible to obtain the variation ΔΨg and ΔΨb.

$$\Delta x \cdot Jxr \cdot \Delta \Psi r = Jxg \cdot \Delta \Psi g + Jxb \cdot \Delta \Psi b$$

$$\Delta y - Jyr \cdot \Delta \Psi r = Jyg \cdot \Delta \Psi g + Jyb \cdot \Delta \Psi b \quad \text{(Expression 57)}$$

In such a case, although the brightness of light Y is not maintained to the target value, the feedback control to maintain the chromaticity coordinates x and y to the target values is performable.

Validity of approximation of the luminous flux to be measured S(λ) by the delta function that is described in the expressions 5 and 10 is additionally described. When the plurality of light emitting elements is collected, fluctuation occurs in emission wavelength even if the colors of the light emitting elements are the same. Thus, the spectrum S(λ) of light that is obtained by integrating light emitted from the light emitting elements does not actually become the delta function as the expressions 5 and 10. Even if fluctuation occurs in emission wavelength, however, the above-described discussion is established by integrating all of the light emitting elements included in the same wavelength band to replace the light emitting elements with a virtual single-color light source that has a wavelength equal to an average value of the wavelengths of the integrated light emitting elements.

Incidentally, when all of the light emitting elements included in the same wavelength band are integrated, expansion of the spectrum width caused by the fluctuation of the wavelength exits. As a result, the chromaticity coordinates slightly move toward white. However, the movement is small, and the calculation of, for example, the chromaticity coordinates in the light source unit is not to determine accurate absolute values but to correct, through the feedback control, impaired white balance that is caused by change of the emission wavelength due to, for example, temperature increase of the light emitting elements. Since the expansion of the spectrum width caused by the fluctuation of wavelength exists before such variation of the emission wavelength occurs. Accordingly, practical disadvantage does not occur to achieve the object of the calculation.

Further, the target values xp, yp, and Yp of the feedback control are additionally described. As described above, various kinds of approximation calculation are performed while assuming that the object of the calculation of, for example, the chromaticity coordinates in the light source unit is not determination of accurate absolute values as described above. Therefore, if the target values xp, yp, and YP are provided as numerical values, it is unknown whether the state achieved by the feedback control becomes desirable state. Such usage is not suitable. For example, in a case where the light source unit is applied to a projector, the light source unit is actually mounted on an actual unit of the projector, and an image to be white color is projected on a screen while the feedback control is stopped. The light intensity of each of R, G, and B of the light source unit is manually adjusted so as to obtain desired white color. The values x, y, and Y measured by the light source unit itself at the end of the adjustment may be preferably stored as the target values xp, yp, and Yp. The actual values of the stored target values do not matter. The state where the desired white color is obtainable is achieved by performing the feedback control after that. The above statement relating to the target values xp, yp, and Yp applies to the target values Xp, Yp, and Zp of the tristimulus values.

The determination of the deviation from normal wavelength $\Delta\lambda r$, $\Delta\lambda g$, and $\Delta\lambda b$ by solving the above-described expressions 8, 11, and 12 and calculation of the tristimulus values X, Y, and Z and the chromaticity coordinates x and y at that time with use of the deviation from normal wavelength have been described. In addition, there has been presented the calculation method using the determined values of the deviation from normal wavelength $\Delta\lambda r$, $\Delta\lambda g$, and $\Delta\lambda b$ in determination of the coefficients Hxr, Hxg, Hxb, Hyr, Hyg, Hyb, Hzr, Hzg, Hzb, Jxr, Jxg, Jxb, Jyr, Jyg, and Jyb of the expressions 49 and 55 that are linear equations for the feedback control.

FIG. 2 illustrates a configuration in which one luminous flux characteristic measurement means is provided for the integrated output luminous flux from element light sources of one color. In this configuration, the deviation from normal wavelength $\Delta\lambda r$, $\Delta\lambda g$, and $\Delta\lambda b$ calculated by the control circuit (Mc) is determined to one value for each color. Accordingly, the calculation method dependent on the coefficient Hxr, Hxg, Hxb, Hyr, Hyg, Hyb, Hzr, Hzg, Hzb, Jxr, Jxg, Jxb, Jyr, Jyg, and Jyb is directly applicable.

However, in a case where a plurality of luminous flux characteristic measurement means are provided for the output luminous flux of one color as in the configuration in which the luminous flux characteristics measurement means is provided for each elemental light source as illustrated in FIG. 1, when the deviation from normal wavelength $\Delta\lambda r$, $\Delta\lambda g$, and $\Delta\lambda b$ are calculated based on the luminous flux chromaticity-intensity correlation data measured by respective luminous flux characteristic measurement means, the values of the deviation from normal wavelength $\Delta\lambda r$, $\Delta\lambda g$, and $\Delta\lambda b$ normally differs for each of the luminous flux characteristic measurement means. Even in such a case, the integrated tristimulus values X, Y, and Z and the chromaticity coordinates x and y of the output luminous flux of that color are allowed to be quantified by calculation according to the expression 1. When the tristimulus values and the chromaticity coordinates for each color are allowed to be quantified, the tristimulus values and the chromaticity coordinates of integrated light of the R-color output luminous flux (Fr), the G-color output luminous flux (Fg), and the B-color output luminous flux (Fb) are allowed to be quantified. Moreover, when an average value is used, the deviation from normal wavelength of that color is also allowed to be determined to one value. Accordingly, the calculation method in which the above-described coefficients are dependent on the deviation from normal wavelength $\Delta\lambda r$, $\Delta\lambda g$, and $\Delta\lambda b$ is indirectly applicable in a similar manner.

However, for example, in a case where a sensor that is allowed to directly measure the tristimulus values X, Y, and Z, and the values of the chromaticity coordinates x and y is used, the calculation method in which the above-described coefficients are dependent on the deviation from normal wavelength $\Delta\lambda r$, $\Delta\lambda g$, and $\Delta\lambda b$ is not applicable.

In the following, description is given of a calculation method of determining the values by approximating all of the deviation from normal wavelength $\Delta\lambda r$, $\Delta\lambda g$, and $\Delta\lambda b$ to zero. The calculation method is applicable even in such a case.

Although accuracy of the calculation is deteriorated by approximating all of the deviation from normal wavelength $\Delta\lambda r$, $\Delta\lambda g$, and $\Delta\lambda b$ to zero, influence of the deterioration appears as slight deviation of the directions of the respective vectors $\Delta\lambda$, $\Delta Y$, and $\Delta Z$ and $\Delta x$, $\Delta y$, and $\Delta Y$ obtained by solving the expressions 49 and 55, as compared with those in the case where approximation is not performed. The calculation is repeatedly performed in the feedback control loop. Therefore, even if deviation occurs, the tristimulus values X, Y, and Z and the chromaticity coordinates x and y approach asymptotically to the target values Xp, Yp, Zp, xp, and yp, respectively. When such approximation is performed, asymptotic speed to the targets may be deteriorated, but calculation of the coefficients is simplified advantageously.

When the luminous flux intensity indicating values under approximation in which the deviation from normal wavelength is approximated to zero are denoted by $\Psi r$, $\Psi g$, and $\Psi b$ that are the same symbols in the case where approximation is not performed, the tristimulus values X, Y, and Z corresponding to the above-described expressions 46, 47, and 48 are represented by the following expressions (expression 58).

$$X = Hxro \cdot \Psi r + Hxgo \cdot \Psi g + Hxbo \cdot \Psi b$$

$$Y = Hyro \cdot \Psi r + Hygo \cdot \Psi g + Hybo \cdot \Psi b$$

$$Z = Hzro \cdot \Psi r + Hzgo \cdot \Psi g + Hzbo \cdot \Psi b$$

where $$Hxro = xe(\lambda ro) + hr \cdot xe(\lambda go')$$

$$Hxgo = xe(\lambda go) + hg \cdot xe(\lambda ro')$$

$$Hxbo = xe(\lambda bo) + hb \cdot xe(\lambda go'')$$

$$Hyro = ye(\lambda ro) + hr \cdot ye(\lambda go')$$

$$Hygo = ye(\lambda go) + hg \cdot ye(\lambda ro')$$

$$Hybo = ye(\lambda bo) + hb \cdot ye(\lambda go'')$$

$$Hzro = ze(\lambda ro) + hr \cdot ze(\lambda go')$$

$$Hzgo = ze(\lambda go) + hg \cdot ze(\lambda ro')$$

$$Hzbo = ze(\lambda bo) + hb \cdot ze(\lambda go'') \qquad \text{(Expression 58)}$$

As a result, the following expressions (expression 59) are obtained as the equations to be solved in the feedback control loop in place of the above-described expression 49.

$$\Delta X\lambda = Hxro \cdot \Delta\Psi r + Hxgo \cdot \Delta\Psi g + Hxbo \cdot \Delta\Psi b$$

$$\Delta Y = Hyro \cdot \Delta\Psi r + Hygo \cdot \Delta\Psi g + Hybo \cdot \Delta\Psi b$$

$$\Delta Z = Hzro \cdot \Delta\Psi r + Hzgo \cdot \Delta\Psi g + Hzbo \cdot \Delta\Psi b \quad \text{(Expression 59)}$$

In this way, the variation of the color-phase indicating values when the luminous flux intensity indicating values for the R-color output luminous flux (Fr), the G-color output luminous flux (Fg), and the B-color output luminous flux (Fb) are slightly varied are represented by the linear operation with use of the variation of the luminous flux intensity indicating values, and the coefficients at that time are determined.

The values $\Delta X$, $\Delta Y$, and $\Delta Z$ on the left side of the expressions may be calculated with use of the above-described expression 50 based on the target values Xp, Yp, and Zp of the tristimulus values and the values of the tristimulus values X, Y, and Z at that time. First, the first light intensity data of the R-color main component light and the second light intensity data of R-color main component light, namely, Rm and Rn measured with use of the R-color luminous flux characteristic measurement means (Ar), the first light intensity data of the G-color main component light and the second light intensity data of G-color main component light, namely, Gm and Gn measured with use of the G-color luminous flux characteristic measurement means (Ag), and the first light intensity data of the B-color main component light and the second light intensity data of the B-color main component light, namely, Bm and Bn measured with use of the B-color luminous characteristic measurement means (Ab) may be acquired. Subsequently, the expressions 8, 11, and 12 may be solved to determine the luminous flux intensity indicating values $\Psi r$, $\Psi g$, and $\Psi b$ and the deviation from normal wavelength $\Delta\lambda r$, $\Delta\lambda g$, and $\Delta\lambda b$ as the wavelength deviation indicating values. Then, the values of the tristimulus values X, Y, and Z may be determined by calculation using the expressions 46, 47, and 48.

Likewise, auxiliary coefficients Ir, Ig, and Ib of the expression 51 relating to the chromaticity coordinates x and y and expressions corresponding to the expression 54 under the approximation in which the deviation from normal wavelength is approximated to zero are represented by the following expressions (expressions 60 and 61).

$$Iro = Hxro + Hyro + Hzro$$

$$Igo = Hxgo + Hygo + Hzgo$$

$$Ibo = Hxbo + Hybo + Hzbo \quad \text{(Expression 60)}$$

$$Jxro = \{Hxro - Iro \cdot x\}/T$$

$$Jxgo = \{Hxgo - Igo \cdot x\}/T$$

$$Jxbo = \{Hxbo - Ibo \cdot x\}/T$$

$$Jyro = \{Hyro - Iro \cdot y\}/T$$

$$Jygo = \{Hygo - Igo \cdot y\}/T$$

$$Jybo = \{Hybo - Ibo \cdot y\}/T \quad \text{(Expression 61)}$$

Incidentally, as described above, first, the first light intensity data of the R-color main component light and the second light intensity data of R-color main component light, namely, Rm and Rn measured with use of the R-color luminous flux characteristic measurement means (Ar), the first light intensity data of the G-color main component light and the second light intensity data of G-color main component light, namely, Gm and Gn measured with use of the G-color luminous flux characteristic measurement means (Ag), and the first light intensity data of the B-color main component light and the second light intensity data of the B-color main component light, namely, Bm and Bn measured with use of the B-color luminous characteristic measurement means (Ab) are acquired. Subsequently, the expressions 8, 11, and 12 are solved to determine the luminous flux intensity indicating values $\Psi r$, $\Psi g$, and $\Psi b$ and the deviation from normal wavelength $\Delta\lambda r$, $\Delta\lambda g$, and $\Delta\lambda b$ as the wavelength deviation indicating values. Then, the values x, y, and T are calculated by applying the values of the tristimulus values X, Y, and Z that are calculated by the expressions 46, 47, and 48 to the uppermost expression of the expression 51, namely, the following expression and to the expression 52.

$$T = X + Y + Z \text{(redescribed)}$$

Then, the following expressions (expression 62) that are expressions to be solved in the feedback control loop in place of the expression 55 are obtained.

$$\Delta x = Jxro \cdot \Delta\Psi r + Jxgo \cdot \Delta\Psi g + Jxbo \cdot \Delta\Psi b$$

$$\Delta y = Jyro \cdot \Delta\Psi r + Jygo \cdot \Delta\Psi g + Jybo \cdot \Delta\Psi b$$

$$\Delta Y = Hyro \cdot \Delta\Psi r + Hygo \cdot \Delta\Psi g + Hybo \cdot \Delta\Psi b \quad \text{(Expression 62)}$$

In this way, the variation of the color-phase indicating values when the luminous flux intensity indicating values for the R-color output luminous flux (Fr), the G-color output luminous flux (Fg), and the B-color output luminous flux (Fb) are slightly varied are represented by the linear operation with use of the variation of the luminous flux intensity indicating values, and the coefficients at that time are determined.

The values $\Delta x$, $\Delta y$, and $\Delta Y$ on the left side of the expressions may be calculated by the expression 56, based on the target values xp, yp, and Yp of the chromaticity coordinates x and y and the brightness indicating value Y and the values x, y, and Y at that time. Also in the case where approximation in which the deviation from normal wavelength is approximated to zero is performed, one of the luminous flux intensity indicating values $\Psi r$, $\Psi g$, and $\Psi b$ is eliminated from the expression 62, and the feedback control to maintain only the chromaticity coordinates x and y to the target values may be performed, by using the same method described with reference to the expression 57.

Also in the case where the approximation in which the deviation from normal wavelength is approximated to zero is performed, the above-described expressions 13, 16, and 17 are effectively used for determination of each of the total output power Ptr of the drive circuits driving the light emitting elements that generate the R-color output luminous flux (Fr), the total output power Ptg of the drive circuits driving the light emitting elements that generate the G-color output luminous flux (Fg), and the total output power Ptb of the drive circuits driving the light emitting elements that generate the B-color output luminous flux (Fb), out of the above-described drive circuits (Pr1, Pr2, . . . , Pra, Pg1, Pg2, . . . , Pb1, Pb2, . . . , Pba). After the variation $\Delta\Psi r$, $\Delta\Psi g$, and $\Delta\Psi b$ are obtained by solving the expression 59 or 62, the control circuit (Mc) applies, with respect to the current values $\Psi r$, $\Psi g$, and $\Psi b$ of the luminous flux intensity indicating values, the obtained variation $\Delta\Psi r$, $\Delta\Psi g$, and ΔΨb to the expression 17 to calculate new target values Ψrp, Ψgp, and Ψbp of the luminous flux intensity indicating values. The control circuit (Mc) then updates the total output power Pr, Pg, and Pb of the drive circuits (Pr1, Pr2, . . . , Pg1, Pg2, . . . , Pb1, Pb2, . . . ) according to the expression 13. Moreover, the ratios hr, hg, and hb having been already determined are applied to the expression 15 to determine the target values ψrp, ψgp, and ψbp of the luminous flux intensity indicating values ψr, ψg, and ψb. The total output power pr, pg, and pb of the drive circuits (Pra, Pga, Pba, . . . ) are then updated according to the expression 14. The control circuit (Mc) then returns to the operation of acquiring the luminous flux chromaticity-intensity correlation data (Dr, Dg, Db). Subsequently, the above-described sequence is repeated to build the feedback control loop.

Incidentally, as described above, first, the first light intensity data of the R-color main component light and the second light intensity data of R-color main component light, namely, Rm and Rn measured with use of the R-color luminous flux characteristic measurement means (Ar), the first light intensity data of the G-color main component light and the second light intensity data of G-color main component light, namely, Gm and Gn measured with use of the G-color luminous flux characteristic measurement means (Ag), and the first light intensity data of the B-color main component light and the second light intensity data of the B-color main component light, namely, Bm and Bn measured with use of the B-color luminous characteristic measurement means (Ab) are acquired. Subsequently, the expressions 8, 11, and 12 are solved to determine the luminous flux intensity indicating values Ψr, Ψg, and Ψb and the deviation from normal wavelength Δλr, Δλg, and Δλb as the wavelength deviation indicating values. Then, the values of the tristimulus values X, Y, and Z on the left side of the expressions in the expression 58 are calculated by the expressions 46, 47, and 48. The expression 58 is regarded as an equation, and the values obtained by solving the expression 58 may be used as the luminous flux intensity indicating values Ψr, Ψg, and Ψb to be applied to the expressions 16 and 17.

The example in which the first light intensity detector (Arm1) is configured separately from the second light intensity detector (Arm2) has been described above. However, the first light intensity detector (Arm1) and the second light intensity detector (Arm2) are achieved by alternately applying characteristic variation to the same light intensity detector in a time-divisional manner. In this case, the first light intensity detector (Arm1) shares an optical sensor with the second light intensity detector (Arm2). In the case of functioning as the second light intensity detector (Arm2), the light characteristic filter (Ers1, Ers2) different from that in the case of functioning as the first light intensity detector (Arm1) may be provided.

Figure 6:
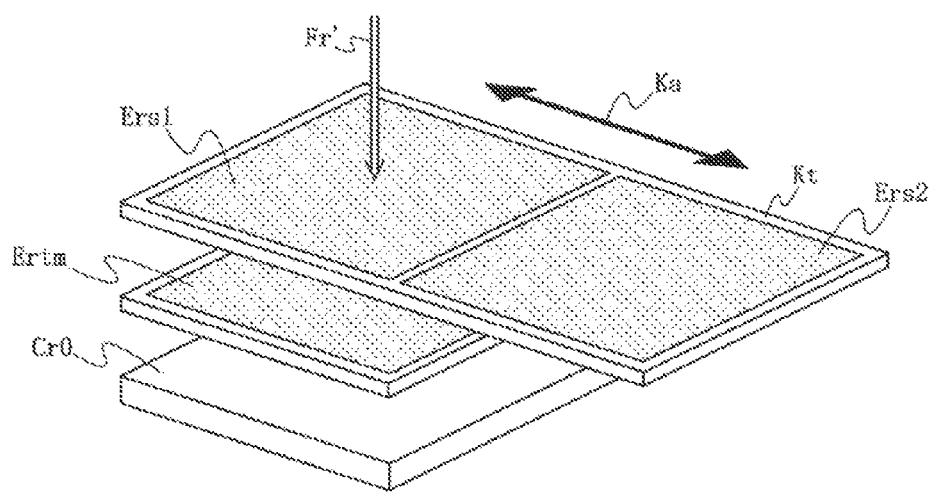
FIG. 6 is a schematic diagram illustrating a part of the light source unit according to the embodiment of the invention in a simplified manner.

For example, as illustrated in FIG. 6 that is a schematic diagram illustrating a part of the light source unit according to the embodiment of the invention in a simplified manner, a filter frame (Kt) attached with the light characteristic filters (Ers1, Ers2) is disposed on a front surface of the common optical sensor (Cr0) that is similar to that described in FIG. 5, and the filter frame (Kt) is moved along an arrow (Ka). When the first light characteristic filter (Ers1) is located on the front surface of the common optical sensor (Cr0), the common optical sensor (Cr0) and the first light characteristic filter (Ers1) may function as the first light intensity detector (Arm1). When the second light characteristic filter (Ers2) is located on the front surface of the common optical sensor (Cr0), the common optical sensor (Cr0) and the second light characteristic filter (Ers2) may function as the second light intensity detector (Arm2).

The main component light filter (Ertm) is disposed in front of the first light characteristic filter (Ers1) and the second light characteristic filer (Ers2) in FIG. 5, and is disposed behind the first light characteristic filter (Ers1) and the second light characteristic filter (Ers2) in FIG. 6. The main component light filter (Ertm) may be disposed in front of or behind the light characteristic filter (Ers1) and the light characteristic filter (Ers2). The configuration in which the light characteristic filters (Ers1, Ers2) are reciprocated is illustrated in FIG. 6. Alternatively, a circular frame provided with the light characteristic filters (Ers1, Ers2) may be disposed and rotated.

In the light source unit according to the embodiment of the invention, the luminous flux intensity indicating values and the wavelength deviation indicating values are calculated from the difference in photodetection signals to light with the same wavelength, based on the difference of the spectral sensitivity characteristics of the light characteristic filters (Ers1, Ers2) respectively included in the first light intensity detector (Arm1) and the second light intensity detector (Arm2). Therefore, if sensitivity variation that is different depending on variation such as temporal change and temperature drift occurs in the optical sensor element in each of the first light intensity detector (Arm1) and the second light intensity detector (Arm2), error may occur in the calculation of the luminous flux intensity indicating values and the wavelength variation indicating values. When the optical sensor is shared in such a way, it is possible to obtain advantage that the calculation is not influenced by the variation as long as interval of light intensity measurement by switch between the first light intensity detector (Arm1) and the second light intensity detector (Arm2) is sufficiently shorter than the variation time scale.

As the optical sensor, an image pickup element may be used in addition to an optical sensor detecting light intensity. Any of the optical sensors included in the R-color luminous flux characteristic measurement means (Ar), the G-color luminous flux characteristic measurement means (Ag), and the B-color luminous flux characteristic measurement means (Ab) may be the image pickup element.

The configuration in which light is transmitted with use of the optical fiber has been described with reference to FIG. 2. Since the optical fiber is formed of fragile glass such as quartz, the optical fiber disadvantageously has a risk of breakage. If the optical fiber is broken, optical power is leaked from the broken part and leaked optical power is absorbed by a covering material that is provided to mechanically protect the optical fiber, which may cause burning out of the covering material. Therefore, safety measures that detect breakage of the optical fiber and turn off the light emitting elements are necessary. When large power is transmitted as a whole, the optical power is divided and transmitted by a plurality of optical fibers, which is advantageous in terms of configuration of the optical system and safety even if the light has the same color. In such a case, desirably, the light intensity per one optical fiber may be monitored in addition to the integral light intensity from all of the optical fibers, and breakage of the optical fiber may be detected individually.

As described above, in the case where the exit ends (Eor1, Eor2, . . . ) of the respective optical fibers (Efr1, Efr2, . . . ) are bundled such that the exit ends are aligned so as to be positioned on the same plane, by projecting an image on a plane at which the exits ends (Eo1, Eo2, . . . ) are positioned, to the image pickup element with use of, for example, a lens, it is possible to identify each optical fiber and monitor the light intensity, and it is thus possible to detect breakage of the optical fiber individually.

Figure 7:
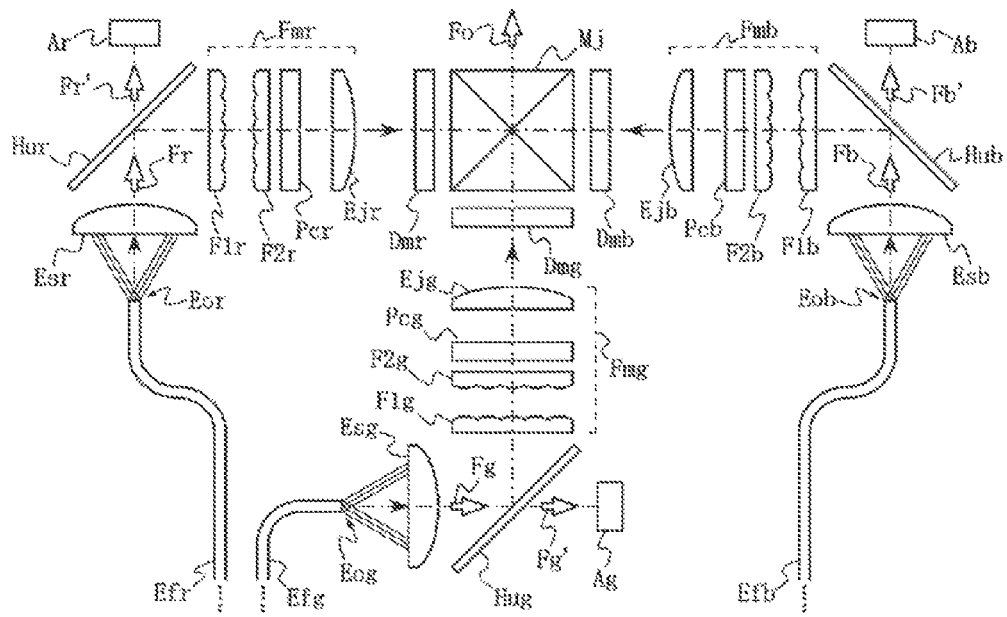
FIG. 7 is a diagram illustrating an example of a projector according to an embodiment of the invention in a simplified manner.

Next, with reference to FIG. 7 that is a diagram illustrating an example of a projector according to an embodiment of the invention in a simplified manner, more specific configuration of the optical fibers and subsequent to the exit ends of the optical fibers in the projector according to the embodiment of the invention that uses the light source unit according to the embodiment of the invention is described.

The light source unit has a configuration in which a fiber bundle configured of a plurality of optical fibers for each of the three primary colors R, G, and B, namely, a fiber bundle for R light source (Efr), a fiber bundle for G light source (Efg), and a fiber bundle for B light source (Erb) are configured so that the respective exit ends of the optical fibers are aligned and bundled. A configuration including the respective fiber bundles in front thereof may be as illustrated in, for example, FIG. 2.

Images at the exit ends (Eor, Eog, Eob) of the three fiber bundles are respectively converted into infinite images by respective collimator lenses (Esr, Esg, Esb) to generate the R-color output luminous flux (Fr), the G-color output luminous flux (Fg), and the B-color output luminous flux (Fb). The respective luminous fluxes are reflected by respective mirrors (Hur, Hug, Hub) to enter respective homogenerizing means (Fmr, Fmg, Fmb) configured of fly eye integrators that respectively include front fly eye lenses (F1r, F1g, F1b), rear fly eye lenses (F2r, F2g, F2b), polarization aligning devices (Pcr, Pcg, Pcb), illumination lenses (Ejr, Ejg, Ejb). Then, an LCD for R-color image (Dmr), and an LCD for G-color image (Dmg), and an LCD for B-color image (Dmb) that are two-dimensional light intensity modulators are illuminated with the respective luminous fluxes output from the homogenizing means (Fmr, Fmg, Fmb), and the transmitted luminous fluxes of the three colors are color-synthesized to generate a luminous flux (Fo) forming a color image. The luminous flux is projected on the screen by the projection lens (not illustrated).

The mirrors (Hur, Hug, Hub) are so fabricated as to effectively reflect the main component light and the additional light that are to enter the respective mirrors (Hur, Hug, Hub) and form the R-color output luminous flux (Fr), the G-color output luminous flux (Fg), and the B-color output luminous flux (Fb). However, unreflected transmitted light exists to no small extent, and such light is normally discarded as stray light. In the light source unit in FIG. 7, however, such light is effectively used to acquire the measurement-use output luminous fluxes (Fr', Fg', Fb'). The measurement-use output luminous fluxes (Fr', Rg', Fb') enter the R-color luminous flux characteristic measurement means (Ar), the G-color luminous flux characteristic measurement means (Ag), and the B-color luminous flux characteristic measurement means (Ab).

Figure 8:
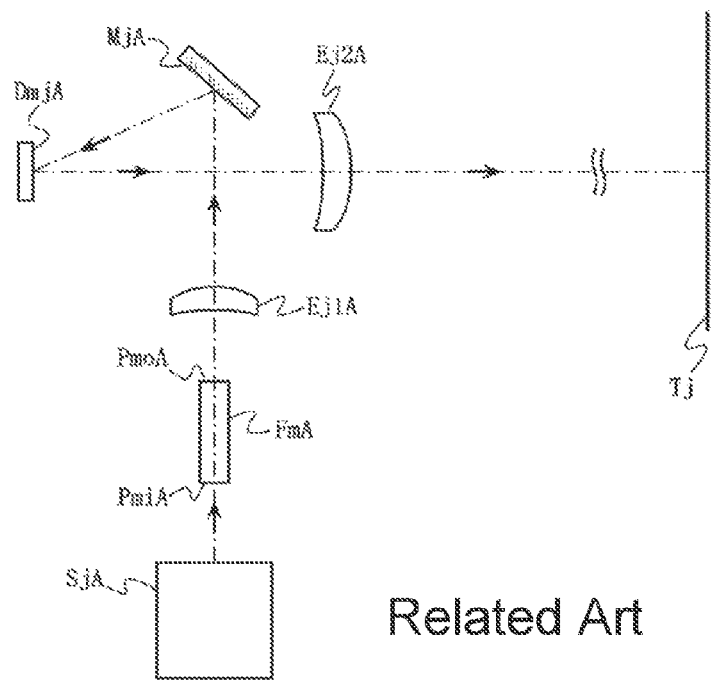
FIG. 8 is a diagram for explaining a part of one kind of existing projectors of related art.
Figure 9:
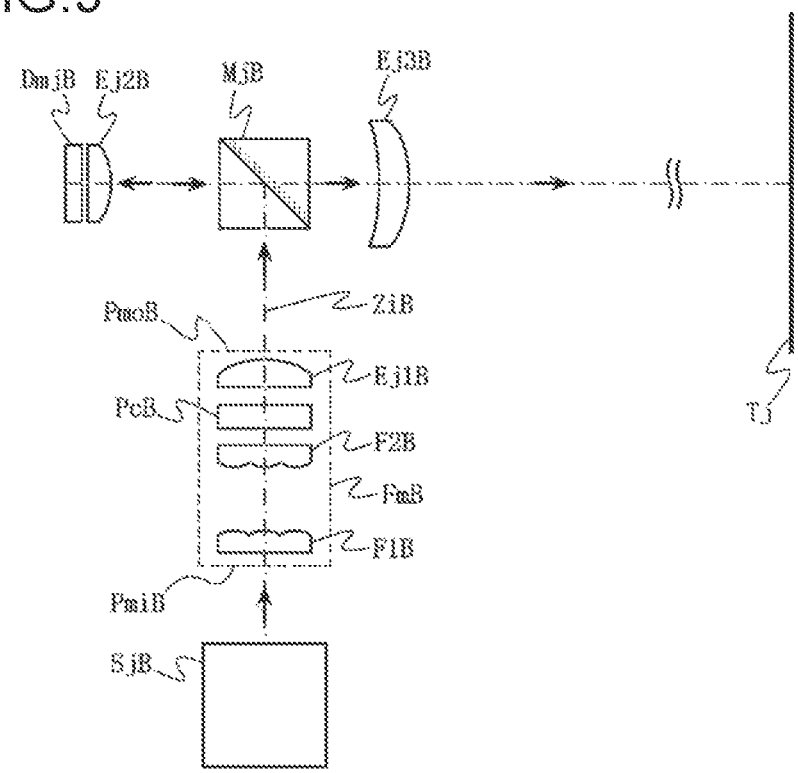
FIG. 9 is a diagram for explaining a part of one kind of existing projectors of related art.

In the example, an LCD projector using the homogenizing means configured of the fly eye integrator is described; however, the projector according to the embodiment of the invention is applicable to the LCOS (trademark) projector described above with reference to FIG. 9, and the DMD (trademark) projector using the homogenizing means by a light guide described above with reference to FIG. 8.

What is claimed is:

1. A light source unit comprising:
   a plurality of elemental light sources each including a light emitting element and a drive circuit, the light emitting element is configured to emit a light of a predetermined wavelength band, the drive circuit is configured to drive the light emitting element;
   a control circuit configured to control the drive circuit; and
   a luminous flux characteristic measurement section configured to receive an R-color output luminous flux, a G-color output luminous flux, and a B-color output luminous flux each of which is configured of radiated light from the light emitting element, the luminous flux characteristic measurement section is configured to measure the received output luminous fluxes and to generate luminous flux chromaticity-intensity correlation data correlated with light chromaticity coordinates and light intensity, wherein the R-color output luminous flux, the G-color output luminous flux and the B-color output luminous flux being radiated to outside through optical paths different from one another while being separated from one another,
   wherein the G-color output luminous flux includes a main component light output from a G-color light emitting element,
   the R-color output luminous flux is generated by mixing a main component light output from an R-color light emitting element and an additional light output from a first G-color light emitting element that is independent of the G-color light emitting element,
   the B-color output luminous flux is generated by mixing a main component light output from a B-color light emitting element and an additional light output from a second G-color light emitting element that is independent of the G-color light emitting element,
   the control circuit is configured to intermittently acquire the luminous flux chromaticity-intensity correlation data for each of the R-color output luminous flux, the G-color output luminous flux, and the B-color output luminous flux,
   the control circuit is configured to generate a single-color color-phase indicating value correlated with at least one of color chromaticity coordinates of an output luminous flux generated by mixing with the additional light, based on the luminous flux chromaticity-intensity correlation data,
   the control circuit is configured to determine a ratio of intensity of the additional light to intensity of the main component light to allow the single-color color phase indicating value to become equal to a target value of the single-color color phase indicating value, and generates an integrated color-phase indicating value, for an output luminous flux generated by mixing with the additional light, correlated with chromaticity coordinates of integrated light of the R-color output luminous flux, the G-color output luminous flux, and the B-color output luminous flux, based on the luminous flux chromaticity-intensity correlation data, and
   the control circuit is configured to perform feedback control on the drive circuits for each of the R-color output luminous flux, the G-color output luminous flux, and the B-color output luminous flux to allow a difference between the integrated color-phase indicating value and a target value of the integrated color-phase indicating value to be small.

2. The light source unit according to claim 1, wherein the control circuit is configured to generate a brightness indicating value correlated with brightness of the integrated light, and
   the control circuit is configured to perform the feedback control to allow a difference between the brightness indicating value and a target value of the brightness indicating value to be small.

3. The light source unit according to claim 1, wherein the G-color output luminous flux is generated by mixing the main component light and additional light, the main component light being output from the G-color light emitting element, the additional light being output from one of the light emitting elements for R-color, G-color, and B-color independent of the R-color light emitting element, the G-color light emitting element, and the B-color light emitting element.

4. The light source unit according to claim 1, wherein the luminous flux characteristic measurement section is configured to measure deviation from normal wavelength and intensity of the main component light of the received output luminous flux and further measures intensity of the additional light of the output luminous flux generated by mixing with the additional light to generate the luminous flux chromaticity-intensity correlation data.

5. The light source unit according to claim 1, wherein the luminous flux characteristic measurement section includes a first light intensity detector and a second light intensity detector, the first light intensity detector and the second light intensity detector each being used to measure deviation from normal wavelength and intensity of the main component light of the received output luminous flux and being different from each other in rate of sensitivity varying against wavelength varying at least in the vicinity of a wavelength of the main component light.

6. The light source unit according to claim 5, wherein
the first light intensity detector and the second light intensity detector each include an optical sensor, and
a light characteristic filter of which spectral transmittance is varied with wavelength varying is provided on a front surface of one or both of the optical sensors.

7. The light source unit according to claim 5, wherein
the first light intensity detector and the second light intensity detector are realized by a single light intensity detector alternately provided with time-divisional characteristic variation,
the first light intensity detector is configured to share an optical sensor with the second light intensity detector, and
when the optical sensor functions as the second light intensity detector, a light characteristic filter different from a light characteristic filter when the optical sensor functions as the first light intensity detector, is provided.

8. The light source unit according to claim 5, wherein one or both of the first light intensity detector and the second light intensity detector are image pickup elements.

9. The light source unit according to claim 1, wherein
the control circuit has local color band color matching function information including, as color matching functions used for calculation of chromaticity, a function value at normal wavelength of the main component light, a rate of function output varying against wavelength varying, and a function value at normal wavelength of the additional light in the R-color output luminous flux, the G-color output luminous flux, and the B-color output luminous flux,
the control circuit is configured to generate the single-color color-phase indicating value for the output luminous flux generated by mixing with the additional light with use of the luminous flux chromaticity-intensity correlation data and the local color band color matching function information, and
the control circuit is configured to generate the integrated color-phase indicating value for the integrated light with use of the luminous flux chromaticity-intensity correlation data and the local color band color matching function information.

10. The light source unit according to claim 1, wherein the control circuit is configured to generate a luminous flux intensity indicating value correlated with intensity for each of the R-color output luminous flux, the G-color output luminous flux, and the B-color output luminous flux, based on the luminous flux chromaticity-intensity correlation data,
the control circuit is configured to determine coefficients of linear operation, the linear operation representing variation of the integrated color-phase indicating value when the luminous flux intensity indicating values for the R-color output luminous flux, the G-color output luminous flux, and the B-color output luminous flux are slightly varied, with use of variation of the luminous flux intensity indicating values, and
the control circuit is configured to determine the variation of the luminous flux intensity indicating values for the R-color output luminous flux, the G-color output luminous flux, and the B-color output luminous flux through the coefficients to perform the feedback control.

11. A projector provided with a light source unit, and a projection display section configured to project and display an image with use of the light source unit, the light source unit comprising:
a plurality of elemental light sources each including a light emitting element and a drive circuit, the light emitting element configured to emit light of a predetermined wavelength band, the drive circuit configured to drive the light emitting element;
a control circuit configured to control the drive circuit; and
a luminous flux characteristic measurement section configured to receive an R-color output luminous flux, a G-color output luminous flux, and a B-color output luminous flux each of which is configured of radiated light from the light emitting element and measure the received output luminous fluxes to generate luminous flux chromaticity-intensity correlation data correlated with chromaticity coordinates of light and light intensity, the R-color output luminous flux, the G-color output luminous flux and the B-color output luminous flux being radiated to outside through optical paths different from one another while being separated from one another,
wherein the G-color output luminous flux includes a main component light output from a G-color light emitting element,
the R-color output luminous flux is generated by mixing a main component light output from an R-color light emitting element and an additional light output from a first G-color light emitting element that is independent of the G-color light emitting element,
the B-color output luminous flux is generated by mixing a main component light output from a B-color light emitting element and an additional light output from a second G-color light emitting element that is independent of the G-color light emitting element,
the control circuit intermittently acquires the luminous flux chromaticity-intensity correlation data for each of the R-color output luminous flux, the G-color output luminous flux, and the B-color output luminous flux,
the control circuit generates a single-color color-phase indicating value correlated with at least one of chromaticity coordinates of an output luminous flux generated by mixing with the additional light, based on the luminous flux chromaticity-intensity correlation data, the control circuit is configured to determine a ratio of intensity of the additional light to intensity of the main component light to allow the single-color color phase indicating value to become equal to a target value of the single-color color phase indicating value, and generates an integrated color-phase indicating value, for an output luminous flux generated by mixing with the additional light, correlated with chromaticity coordinates of integrated light of the R-color output luminous flux, the G-color output luminous flux, and the B-color output luminous flux, based on the luminous flux chromaticity-intensity correlation data, and the control circuit is configured to perform feedback control on the drive circuits for each of the R-color output luminous flux, the G-color output luminous flux, and the B-color output luminous flux to allow a difference between the integrated color-phase indicating value and a target value of the integrated color-phase indicating value to be small.

* * * * *